(12) United States Patent
Kim et al.

(10) Patent No.: US 11,493,847 B2
(45) Date of Patent: Nov. 8, 2022

(54) STRUCTURE FOR A QUANTUM DOT BARRIER RIB AND PROCESS FOR PREPARING THE SAME

(71) Applicant: ROHM AND HAAS ELECTRONIC MATERIALS KOREA LTD., Chungcheongnam-do (KR)

(72) Inventors: Seung-Keun Kim, Gyeonggi-do (KR); Hyung-Tak Jeon, Gyeonggi-do (KR); Kyu Cheol Lee, Gyeonggi-do (KR); Kyung-Jae Park, Gyeonggi-do (KR); Seung-Kyu Song, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 426 days.

(21) Appl. No.: 16/879,173

(22) Filed: May 20, 2020

(65) Prior Publication Data
US 2020/0371436 A1    Nov. 26, 2020

(30) Foreign Application Priority Data

May 24, 2019  (KR) .................. 10-2019-0061476
May 15, 2020  (KR) .................. 10-2020-0058471

(51) Int. Cl.
*G03F 7/09*   (2006.01)
*G03F 7/38*   (2006.01)
(Continued)

(52) U.S. Cl.
CPC ........... *G03F 7/094* (2013.01); *C08F 212/08* (2013.01); *C08F 220/06* (2013.01);
(Continued)

(58) Field of Classification Search
CPC . G03F 7/094; G03F 7/38; G03F 7/028; G03F 7/40; C08K 5/3492; C08K 5/33;
(Continued)

(56) References Cited

U.S. PATENT DOCUMENTS 10,481,493 B2 * 11/2019 Park ................... G03F 7/031
10,534,261 B2 *  1/2020 Jeon ................... G03F 7/0007
(Continued)

FOREIGN PATENT DOCUMENTS

JP    2015-161815 A       9/2015
JP    2015161815 A  *     9/2015

*Primary Examiner* — Michael M. Bernshteyn
(74) *Attorney, Agent, or Firm* — G. Creston Campbell

(57) ABSTRACT

The present invention relates to a structure for a quantum dot barrier rib and a process for preparing the same. The structure for a quantum dot barrier rib of the present invention comprises a cured film having a uniform film thickness and an appropriate range of film thickness. Here, the reflectance $R_{SCI}$ measured by the SCI (specular component included) method and the reflectance $R_{SCE}$ measured by the SCE (specular component excluded) method are reduced, and the ratio between them ($R_{SCE}/R_{SCI}$) is appropriately adjusted, so that it is possible to satisfy such characteristics as high light-shielding property and low reflectance at the same time while the resolution and pattern characteristics are maintained to be excellent. In addition, when the structure for a quantum dot barrier rib is prepared, it is possible to form a multilayer pattern having a uniform film thickness suitable for the quantum dot barrier ribs in a single development process. Thus, it can be advantageously used for a quantum dot display.

20 Claims, 3 Drawing Sheets

(51) Int. Cl.

| | |
|---|---|
| C08K 5/34 | (2006.01) |
| C08K 5/33 | (2006.01) |
| C08K 5/11 | (2006.01) |
| C08F 220/32 | (2006.01) |
| C08F 220/24 | (2006.01) |
| C08F 220/18 | (2006.01) |
| C08F 220/06 | (2006.01) |
| C08F 222/40 | (2006.01) |
| C08F 212/08 | (2006.01) |
| C08K 5/00 | (2006.01) |
| C08K 3/04 | (2006.01) |
| G02F 1/13 | (2006.01) |
| G03F 7/40 | (2006.01) |
| B82Y 20/00 | (2011.01) |
| C08K 5/3492 | (2006.01) |
| G03F 7/028 | (2006.01) |
| G02F 1/13357 | (2006.01) |
| G02F 1/1335 | (2006.01) |

(52) U.S. Cl.
CPC ...... *C08F 220/1804* (2020.02); *C08F 220/24* (2013.01); *C08F 220/325* (2020.02); *C08F 222/40* (2013.01); *C08K 3/04* (2013.01); *C08K 5/0041* (2013.01); *C08K 5/11* (2013.01); *C08K 5/33* (2013.01); *C08K 5/3492* (2013.01); *G02F 1/133516* (2013.01); *G02F 1/133617* (2013.01); *G03F 7/028* (2013.01); *G03F 7/38* (2013.01); *G03F 7/40* (2013.01); *B82Y 20/00* (2013.01)

(58) Field of Classification Search
CPC .. C08K 5/11; C08K 5/041; C08K 3/04; C08F 220/325; C08F 220/24; C08F 220/1804; C08F 220/06; C08F 222/40; C08F 212/08; G02F 1/133617; G02F 1/133616; B82Y 20/00
USPC .......................................... 430/312
See application file for complete search history.

(56) References Cited

U.S. PATENT DOCUMENTS 10,884,335 B2 * 1/2021 Jeong ..................... C08L 63/00
2020/0135967 A1 * 4/2020 Cho ..................... H01L 51/5253

* cited by examiner

STRUCTURE FOR A QUANTUM DOT BARRIER RIB AND PROCESS FOR PREPARING THE SAME

TECHNICAL FIELD

The present invention relates to a structure for a quantum dot barrier rib that satisfies such characteristics as high light-shielding property and low reflectance and a process for preparing the same.

BACKGROUND ART

In recent years, interest in various electronic devices employing quantum dots (QDs) has increased.

Quantum dots are a material that produces an effect of quantum confinement as a nanocrystal of a semiconductor material having a diameter of approximately 10 nm or less. Although they are composed of hundreds of thousands of electrons or more, most electrons are firmly bound to the atomic nucleus, so that the number of free electrons that are not bound is limited to about 1 to 100. In such event, the energy level of the electrons is discontinuously limited to show electrical and optical characteristics different from those of a semiconductor in a bulk state that forms a continuous band. These quantum dots can produce various colors by generating light wavelengths of different lengths for each particle size even without a change in the material type. Since they have the advantages of high color purity and light safety as compared with conventional light emitters, they are currently used in various fields such as displays, solar cells, biosensors, and lighting, and are drawing attention as a next-generation light-emitting device.

FIG. 1 is a schematic view for illustrating a typical quantum dot device. Referring to FIG. 1, the substrate structure (100) of the quantum dot device comprises a transparent substrate (110) and barrier ribs (120) formed to partition the area on the transparent substrate (110). Different quantum dot solutions, that is, a first quantum dot solution (130), a second quantum dot solution (140), and a third quantum dot solution (150) are present in the respective partitioned areas. The first quantum dot solution (130), the second quantum dot solution (140), and the third quantum dot solution (150) are composed of quantum dots having different energy levels. That is, they are configured to have different emission wavelength bands as the size or material of the quantum dots is manipulated.

Here, the barrier ribs (120) perform not only a light-shielding function, but also a function for preventing the compositions of respective colors discharged to the partitioned areas from being mixed. In general, it may be formed as a film from a photosensitive resin composition.

In such event, the photosensitive resin composition used should be capable of preventing deterioration in contrast and color purity caused by light leakage between pixels. In recent years during which research on quantum dot devices has been actively conducted, there is a demand for enhanced performance in terms of excellent pattern characteristics, low reflectance, and high light-shielding property. In addition, in order to be applied to a quantum dot device, it is necessary to accomplish a uniform film and an appropriate film thickness to maintain excellent resolution. For example, if the film is not uniform or the film thickness is too small, it is not suitable for barrier ribs, so that the quantum dot solution may overflow the barrier ribs, resulting in mixing of colors or deterioration in the resolution. If the film thickness is adjusted by coating a photosensitive resin composition thick and curing it in order to solve this problem, it is difficult to accomplish uniform coating, whereby there is a problem that stains or contamination may be generated.

DETAILED DESCRIPTION OF THE INVENTION

Technical Problem

Accordingly, the present invention aims to provide a structure for a quantum dot barrier rib that satisfies such characteristics as high light-shielding property and low reflectance while the resolution and pattern characteristics are maintained to be excellent and a process for preparing the same.

Solution to the Problem

In order to achieve the above object, the present invention provides a structure for a quantum dot barrier rib, which comprises a cured film formed from a photosensitive resin composition comprising (A) a copolymer; (B) a photopolymerizable compound; (C) a photopolymerization initiator; and (D) a colorant comprising a black colorant, wherein the structure for a quantum dot barrier rib has a total thickness of 6 μm or more and an optical density of 0.05/μm to 2.0/μm, and the reflectance $R_{SCI}$ measured by the SCI (specular component included) method and the reflectance $R_{SCE}$ measured by the SCE (specular component excluded) method at a wavelength of 550 nm satisfy the following relationships, respectively:

$$R_{SCI} \leq 5.0\% \quad \text{(Relationship 1)}$$

$$R_{SCE} \leq 0.5\% \quad \text{(Relationship 2)}$$

$$2 \leq R_{SCE}/R_{SCI} \leq 10. \quad \text{(Relationship 3)}$$

In order to achieve another object, the present invention provides a structure for a quantum dot barrier rib, which comprises a first cured film formed from a first photosensitive resin composition and a second cured film formed from a second photosensitive resin composition on the first cured film, wherein the first photosensitive resin composition, the second photosensitive resin composition, or both comprise (A) a copolymer; (B) a photopolymerizable compound; (C) a photopolymerization initiator; and (D) a colorant comprising a black colorant, and the structure has a total thickness of 6 μm or more.

Further, in order to achieve another object, the present invention provides a process for preparing a structure for a quantum dot barrier rib, which comprises coating a first photosensitive resin composition on a substrate and curing it to form a first cured film; coating a second photosensitive resin composition on the first cured film and curing it to form a second cured film; and exposing and developing a multi-layer cured film comprising the first cured film and the second cured film to form a pattern and then curing it, wherein the first photosensitive resin composition, the second photosensitive resin composition, or both comprise (A) a copolymer; (B) a photopolymerizable compound; (C) a photopolymerization initiator; and (D) a colorant comprising a black colorant.

Advantageous Effects of the Invention

The structure for a quantum dot barrier rib of the present invention comprises a cured film having a uniform film thickness and an appropriate range of film thickness. Here, the reflectance $R_{SCI}$ measured by the SCI (specular component included) method and the reflectance $R_{SCE}$ measured by the SCE (specular component excluded) method are reduced, and the ratio between them ($R_{SCE}/R_{SCI}$) is appropriately adjusted, so that it is possible to satisfy such characteristics as high light-shielding property and low reflectance at the same time while the resolution and pattern characteristics are maintained to be excellent.

In addition, when the structure for a quantum dot barrier rib is prepared, it is possible to form a multilayer pattern having a uniform film thickness suitable for the quantum dot barrier ribs in a single development process. Thus, it can be advantageously used for a quantum dot display.

BEST MODE FOR CARRYING OUT THE INVENTION

Figure 1:
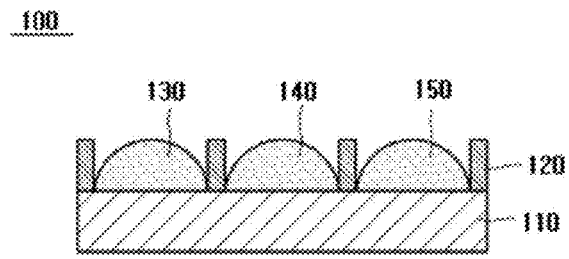
FIG. 1 is a schematic view for illustrating a typical quantum dot device.

The present invention is not limited to those described below. Rather, it can be modified into various forms as long as the gist of the invention is not altered.

Throughout the present specification, when a part is referred to as "comprising" an element, it is understood that other elements may be comprised, rather than other elements are excluded, unless specifically stated otherwise. In addition, all numbers and expressions relating to quantities of components, reaction conditions, and the like used herein are to be understood as being modified by the term "about" unless specifically stated otherwise.

The structure for a quantum dot barrier rib may comprise a cured film formed from a photosensitive resin composition comprising (A) a copolymer; (B) a photopolymerizable compound; (C) a photopolymerization initiator; and (D) a colorant comprising a black colorant. In such event, the photosensitive resin composition may optionally further comprise at least one selected from the group consisting of (E) a surfactant, (F) an additive, and (G) a solvent.

According to an embodiment, the structure for a quantum dot barrier rib has a total thickness of 6 μm or more and an optical density of 0.05/μm to 2.0/μm. The transmittance at 550 nm may be measured using an optical density meter (361T manufactured by Xlite) to obtain the optical density (OD, unit:/μm) based on a thickness of 1 μm of the structure for a quantum dot barrier rib.

In addition, in the structure for a quantum dot barrier rib, the reflectance $R_{SCI}$ measured by the SCI (specular component included) method and the reflectance $R_{SCE}$ measured by the SCE (specular component excluded) method at a wavelength of 360 nm to 740 nm, or 550 nm, may satisfy the following relationships, respectively.

$R_{SCI} \leq 5.0\%$ (Relationship 1)

$R_{SCE} \leq 0.5\%$ (Relationship 2)

$2 \leq R_{SCE}/R_{SCI} \leq 10$. (Relationship 3)

The $R_{SCI}$ refers to the total reflectance that includes the specular reflection of light incident on the surface of an object and reflected at the same angle and the scattered reflection scattered and reflected in various directions without specular reflection. The $R_{SCE}$ refers to the scattered reflection alone, that is, the total reflectance from which the specular reflection is deducted.

Hereinafter, each component of the photosensitive resin composition will be explained in detail.

As used herein, the term "(meth)acryl" refers to "acryl" and/or "methacryl," and the term "(meth)acrylate" refers to "acrylate" and/or "methacrylate."

The weight average molecular weight (g/mole, Da) of each component as described below is measured by gel permeation chromatography (GPC, eluent: tetrahydrofuran) referenced to a polystyrene standard.

(A) Copolymer

The copolymer (A) employed in the present invention may comprise at least two structural units selected from the group consisting of (a-1) a structural unit derived from an ethylenically unsaturated carboxylic acid, an ethylenically unsaturated carboxylic anhydride, or a combination thereof, (a-2) a structural unit derived from an ethylenically unsaturated compound containing an aromatic ring, (a-3) a structural unit derived from an ethylenically unsaturated compound containing an epoxy group, and (a-4) a structural unit derived from an ethylenically unsaturated compound different from (a-1), (a-2), and (a-3).

According to an embodiment, the copolymer (A) may comprise the structural units (a-1) and (a-4).

According to another embodiment, the copolymer (A) may comprise the structural units (a-1), (a-2), and (a-4).

According to another embodiment, the copolymer (A) may comprise the structural units (a-1), (a-3), and (a-4).

According to another embodiment, the copolymer (A) may comprise the structural units (a-1), (a-2), and (a-3).

According to another embodiment, the copolymer (A) may comprise the structural units (a-1), (a-2), (a-3), and (a-4).

The copolymer (A) is an alkali-soluble resin for developability and may also play the role of a base for forming a film upon coating and a structure for forming a final pattern.

(a-1) Structural Unit Derived From an Ethylenically Unsaturated Carboxylic Acid, an Ethylenically Unsaturated Carboxylic Anhydride, or a Combination Thereof The structural unit (a-1) is derived from an ethylenically unsaturated carboxylic acid, an ethylenically unsaturated carboxylic anhydride, or a combination thereof. The ethylenically unsaturated carboxylic acid and the ethylenically unsaturated carboxylic anhydride is a polymerizable unsaturated monomer containing at least one carboxyl group in the molecule. Particular examples thereof may include an unsaturated monocarboxylic acid such as (meth)acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like. The structural unit derived from the above-exemplified compounds may be contained in the copolymer alone or in combination of two or more.

The amount of the structural unit (a-1) may be 5 to 65% by mole, or 10 to 50% by mole, based on the total moles of the structural units constituting the copolymer (A). Within the above range, it may have favorable developability.

(a-2) Structural Unit Derived from an Ethylenically Unsaturated Compound Containing an Aromatic Ring The structural unit (a-2) is derived from an ethylenically unsaturated compound containing an aromatic ring. Particular examples of the ethylenically unsaturated compound containing an aromatic ring may include phenyl (meth) acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing a halogen such as fluorostyrene, chlorostyrene, bromostyrene, and iodostyrene; styrene containing an alkoxy substituent such as methoxystyrene, ethoxystyrene, and propoxystyrene; 4-hydroxystyrene, p-hydroxy-α-methylstyrene, acetylstyrene; and vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, and the like. The structural unit derived from the above-exemplified compounds may be contained in the copolymer alone or in combination of two or more. For polymerizability of the composition, a structural unit derived from styrene compounds is preferred among these examples.

The amount of the structural unit (a-2) may be 1 to 50% by mole, or 3 to 40% by mole, based on the total moles of the structural units constituting the copolymer (A). Within the above range, it may be more advantageous in terms of chemical resistance.

(a-3) Structural Unit Derived from an Ethylenically Unsaturated Compound Containing an Epoxy Group The structural unit (a-3) is derived from an ethylenically unsaturated compound containing an epoxy group. Particular examples of the ethylenically unsaturated compound containing an epoxy group may include glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, 4-hydroxybutyl (meth) acrylate glycidyl ether, 4-hydroxybutyl acrylate glycidyl ether, allyl glycidyl ether, 2-methylallyl glycidyl ether, and the like. The structural unit derived from the above-exemplified compounds may be contained in the copolymer alone or in combination of two or more. At least one selected from the structural units derived from glycidyl (meth)acrylate, 4-hydroxybutyl acrylate glycidyl ether, and 4-hydroxybutyl (meth)acrylate glycidyl ether among the above is more preferable from the viewpoint of copolymerizability and enhancements in the strength of a cured film.

The amount of the structural unit (a-3) may be 1 to 40% by mole, or 5 to 20% by mole, based on the total moles of the structural units constituting the copolymer (A). Within the above range, it may be more advantageous in terms of residues during the process and margins upon pre-bake.

(a-4) Structural Unit Derived from an Ethylenically Unsaturated Compound Different from (a-1), (a-2), and (a-3)

The copolymer (A) employed in the present invention may further comprise a structural unit derived from an ethylenically unsaturated compound different from (a-1), (a-2), and (a-3) in addition to (a-1), (a-2), and (a-3).

Particular examples of the structural unit derived from an ethylenically unsaturated compound different from the structural units (a-1), (a-2), and (a-3) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth) acrylate, cyclohexyl (meth)acrylate, ethylhexyl (meth)acrylate, tetrahydrofurfuryl (meth)acrylate, hydroxyethyl (meth) acrylate, 2-hydroxypropyl (meth)acrylate, 2-hydroxy-3-chloropropyl (meth)acrylate, 4-hydroxybutyl (meth) acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, trifluoroethyl (meth)acrylate, trifluoro (meth)acrylate, tetrafluoropropyl (meth)acrylate, hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, N-cyclohexylmaleimide, and the like. The structural unit derived from the above-exemplified compounds may be contained in the copolymer alone or in combination of two or more.

In addition, according to an embodiment, the structural unit (a-4) may comprise a fluorine-containing compound. For example, it may comprise at least one selected from trifluoroethyl (meth)acrylate, hexafluoroisopropyl (meth) acrylate, and octafluoropentyl (meth)acrylate.

The amount of the structural unit (a-4) may be greater than 0 to 80% by mole, or 30 to 70% by mole, based on the total moles of the structural units constituting the copolymer (A). Within the above range, the storage stability of the photosensitive resin composition may be maintained, and the film retention rate may be more advantageously enhanced.

According to an embodiment, examples of the copolymer having the structural units (a-1) to (a-4) may include a copolymer of (meth)acrylic acid/styrene/methyl (meth)acrylate/glycidyl (meth)acrylate, a copolymer of (meth)acrylic acid/styrene/methyl (meth)acrylate/glycidyl (meth)acrylate/N-phenylmaleimide, a copolymer of (meth)acrylic acid/styrene/methyl (meth)acrylate/glycidyl (meth)acrylate/N-cyclohexylmaleimide, a copolymer of (meth)acrylic acid/ styrene/n-butyl (meth)acrylate/glycidyl (meth)acrylate/N-phenylmaleimide, a copolymer of (meth)acrylic acid/styrene/glycidyl (meth)acrylate/N-phenylmaleimide, a copolymer of (meth)acrylic acid/styrene/4-hydroxybutyl acrylate glycidyl ether/N-phenylmaleimide, and the like. One, two, or more of the copolymers may be contained in the photosensitive resin composition.

According to an embodiment, examples of the copolymer having the structural units (a-1) to (a-4) may include a copolymer of (meth)acrylic acid/methyl (meth)acrylate/trifluoro(meth)acrylate/butyl (meth)acrylate, a copolymer of (meth)acrylic acid/methyl (meth)acrylate/trifluoroethyl (meth)acrylate/butyl (meth)acrylate, a copolymer of (meth)acrylic acid/methyl (meth)acrylate/hexafluoroisopropyl (meth)acrylate/butyl (meth)acrylate, and a copolymer of (meth)acrylic acid/methyl (meth)acrylate/octafluoropentyl (meth)acrylate/butyl (meth)acrylate.

The weight average molecular weight of the copolymer (A) may be 4,000 to 20,000 Da or 6,000 to 15,000 Da. If the weight average molecular weight of the copolymer (A) is within the above range, the step difference by a lower pattern may be advantageously improved, and a pattern profile upon development may be favorable.

The amount of the copolymer (A) in the entire photosensitive resin composition may be 5 to 50% by weight, or 10 to 40% by weight, based on the total weight of the solids content (i.e., the weight excluding solvents) of the photosensitive resin composition. Within the above range, a pattern profile upon development may be favorable, and such properties as film retention rate and chemical resistance may be enhanced.

The copolymer (A) may be prepared by charging to a reactor a radical polymerization initiator, a solvent, and at least two of the structural units (a-1), (a-2), (a-3), and (a-4), followed by charging nitrogen thereto and slowly stirring the mixture for polymerization.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide, lauryl peroxide, t-butyl peroxypivalate, 1,1-bis(t-butylperoxy)cyclohexane, or the like, but it is not limited thereto. The radical polymerization initiator may be used alone or in combination of two or more.

The solvent may be any conventional solvent commonly used in the preparation of the copolymer (A) and may include, for example, propylene glycol monomethyl ether acetate (PGMEA).

(B) Photopolymerizable Compound

The photopolymerizable compound (B) employed in the present invention may be a monofunctional or polyfunctional ester compound having at least one ethylenically unsaturated double bond. In particular, it may be a polyfunctional compound having at least two functional groups from the viewpoint of chemical resistance.

The photopolymerizable compound (B) may be selected from the group consisting of dipentaerythritol hexaacrylate, di(trimethylolpropane) tetraacrylate, ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth)acrylate, trimethylolpropane tri(meth)acrylate, pentaerythritol tri(meth)acrylate, a monoester of pentaerythritol tri(meth)acrylate and succinic acid, pentaerythritol tetra(meth)acrylate, dipentaerythritol penta(meth)acrylate, dipentaerythritol hexa(meth)acrylate, a monoester of dipentaerythritol penta(meth)acrylate and succinic acid, pentaerythritol triacrylate-hexamethylene diisocyanate (a reaction product of pentaerythritol triacrylate and hexamethylene diisocyanate), tripentaerythritol hepta(meth)acrylate, tripentaerythritol octa(meth)acrylate, bisphenol A epoxyacrylate, ethylene glycol monomethyl ether acrylate, and a mixture thereof, but it is not limited thereto.

Examples of the photopolymerizable compound commercially available may include (i) monofunctional (meth)acrylate such as Aronix M-101, M-111, and M-114 manufactured by Toagosei Co., Ltd., KAYARAD T4-110S, T-1420, and T4-120S manufactured by Nippon Kayaku Co., Ltd., and V-158 and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri- and higher functional (meth)acrylate such as Aronix M-309, M-400, M-403, M-405, M-450, M-7100, M-8030, M-8060, and TO-1382 manufactured by Toagosei Co., Ltd., KAYARAD TMPTA, DPHA, and DPHA-40H manufactured by Nippon Kayaku Co., Ltd., and V-295, V-300, V-360, V-GPT, V-3PA, V-400, and V-802 manufactured by Osaka Yuki Kayaku Kogyo Co., Ltd.

The amount of the photopolymerizable compound (B) may be 10 to 200 parts by weight, 10 to 150 parts by weight, 15 to 100 parts by weight, or 15 to 90 parts by weight, based on 100 parts by weight of the copolymer (A) on the basis of the solids content exclusive of solvents. If the amount of the photopolymerizable compound is within the above range, the pattern developability and coating characteristics may be excellent while the film retention rate is maintained to be constant. If the amount of the photopolymerizable compound is less than the above range, the development time becomes longer, which may affect the process and residues. If it exceeds the above range, it may cause a problem that the pattern resolution becomes too high.

(C) Photopolymerization Initiator

The photopolymerization initiator (C) employed in the present invention may be any known photopolymerization initiator.

The photopolymerization initiator (C) may be selected from the group consisting of an acetophenone-based compound, a non-imidazole-based compound, a triazine-based compound, an onium salt-based compound, a benzoin-based compound, a benzophenone-based compound, a polynuclear quinone-based compound, a thioxanthone-based compound, a diazo-based compound, an imidesulfonate-based compound, an oxime-based compound, a carbazole-based compound, a sulfonium borate-based compound, a ketone-based compound, and a mixture thereof.

Specifically, an oxime-based compound, a triazine-based compound, or a combination thereof may be used as the photopolymerization initiator (C). More specifically, a combination of an oxime-based compound and a triazine-based compound may be used.

Particular examples of the photopolymerization initiator (C) may include 2,2'-azobis(2,4-dimethylvaleronitrile), 2,2'-azobis(4-methoxy-2,4-dimethylvaleronitrile), benzoyl peroxide, lauryl peroxide, t-butyl peroxy pivalate, 1,1-bis(t-butylperoxy)cyclohexane, p-dimethylaminoacetophenone, 2-benzyl-2-(dimethylamino)-1-[4-(4-morpholinyl)phenyl]-1-butanone, 2-hydroxy-2-methyl-1-phenyl-propan-1-one, benzyl dimethyl ketal, benzophenone, benzoin propyl ether, diethyl thioxanthone, 2,4-bis (trichloromethyl)-6-p-methoxyphenyl-s-triazine, 2-trichloromethyl-5-styryl-1,3,4-oxodiazole, 9-phenylacridine, 3-methyl-5-amino-((s-triazin-2-yl)amino)-3-phenylcoumarin, 2-(o-chlorophenyl)-4,5-diphenylimidazolyl dimer, 1-phenyl-1,2-propanedione-2-(o-ethoxycarbonyl)oxime, 1-[4-(phenylthio)phenyl]-octane-1,2-dione-2-(o-benzoyloxime), o-enoyl-4'-(benzmercapto) benzoyl-hexyl-ketoxime, 2,4,6-trimethylphenylcarbonyl-diphenylphosphonyloxide, a hexafluorophosphoro-trialkylphenylsulfonium salt, 2-mercaptobenzimidazole, 2,2'-benzothiazolyl disulfide, 2-(4-styrylphenyl)-4,6-bis (trichloromethyl)-1,3,5-triazine, 2-dimethylamino-2-(4-methylbenzyl)-1-(4-morpholin-4-ylphenyl)-butane-1-one, and a mixture thereof, but is not limited thereto.

For reference, examples of the commercially available oxime-based photopolymerization initiators include OXE-01 (BASF), OXE-02 (BASF), OXE-03 (BASF), N-1919 (ADEKA), NCI-930 (ADEKA), NCI-831 (ADEKA), and SPI-03 (Samyang). Examples of the triazine-based photoinitiator include 2-[4-(2-phenylethenyl)phenyl]-4,6-bis (trichloromethyl)-1,3,5-triazine (Triazine Y, Tronly) and the like.

The photopolymerization initiator (C) may be employed in an amount of 0.1 to 10 parts by weight, 0.1 to 8 parts by weight, 0.5 to 8 parts by weight, or 0.5 to 6 parts by weight, based on 100 parts by weight of the copolymer (A) on the basis of the solids content exclusive of solvents.

Specifically, an oxime-based compound in an amount of 0.05 to 4 parts by weight and/or a triazine-based compound in an amount of 0.05 to 2 parts by weight may be employed as the photopolymerization initiator based on 100 parts by weight of the copolymer (A).

More specifically, an oxime-based compound in an amount of 0.05 to 3.5 parts by weight and/or a triazine-based compound in an amount of 0.05 to 1.5 parts by weight may be employed as the photopolymerization initiator based on 100 parts by weight of the copolymer (A). If an oxime-based compound is employed in an amount within the above range, the development and coating characteristics can be enhanced together with high sensitivity. In addition, if a triazine-based compound is employed in an amount within the above range, a cured film with excellent chemical resistance and taper angles upon the formation of a pattern may be obtained together with high sensitivity.

(D) Colorant

The photosensitive resin composition of the present invention may comprise a colorant (D) to impart the light-shielding property thereto. The colorant (D) may comprise a black colorant.

The black colorant may comprise at least one selected from the group consisting of a black organic colorant and a black inorganic colorant. Specifically, the colorant (D) may comprise a mixture of a black organic colorant and a black inorganic colorant. In addition, the colorant (D) may comprise the black organic colorant alone or the black inorganic colorant alone.

In addition, the colorant (D) may comprise a colorant other than the black colorant.

Specifically, the colorant (D) may comprise a black organic colorant and a colorant other than black. Alternatively, the colorant (D) may comprise a black inorganic colorant and a colorant other than black. Alternatively, the colorant (D) may comprise a black organic colorant, a black inorganic colorant, and a colorant other than black. It is preferable that the colorant (D) has high chromogenicity and high thermal resistance.

According to an embodiment, the colorant (D) may comprise the black inorganic colorant and the black organic colorant in a weight ratio of 1 to 50:50 to 99.

According to an embodiment, the colorant (D) may comprise the black organic colorant and the colorant other than black in a weight ratio of 60 to 90:10 to 40.

According to an embodiment, the colorant (D) may comprise the black inorganic colorant and the colorant other than black in a weight ratio of 1 to 40:60 to 99.

According to an embodiment, the colorant (D) may comprise the black inorganic colorant, the black organic colorant and the colorant other than black in a weight ratio of 1 to 50:30 to 80:5 to 40.

Particular examples of the black organic colorant may be at least one selected from the group consisting of aniline black, lactam black, and perylene black. Specifically, BK-7539 (TOKUSHIKI Co. Ltd.) containing organic black may be used. In such event, low reflectance, high light-shielding property, optical density, dielectric constant, and the like may be improved.

Specifically, the black organic colorant may lower the energy bandgap. The lower the energy bandgap, the lower the degree of reflection of light. In addition, the black organic colorant may absorb all wavelength ranges in the visible range, which is advantageous for minimizing reflectance.

Any black inorganic colorant and any colorant other than black known in the art may be used. For example, any compounds classified as a pigment in the Color Index (published by The Society of Dyers and Colourists) and any dyes known in the art may be used.

Particular examples of the black inorganic colorant may include carbon black, titanium black, a metal oxide such as Cu—Fe—Mn-based oxide and synthetic iron black, and the like.

The black organic colorant may be employed in an amount of 20 to 100% by weight, or 40 to 100% by weight, based on the total weight of the solids content (i.e., the weight excluding solvents) of the colorant (D). If the amount of the black organic colorant is within the above range, a pattern profile upon development may be favorable, and such properties as film retention rate may be enhanced. However, if the amount of the black organic colorant is less than 20% by weight based on the total weight of the solids content of the colorant (D), the optical density and low reflectance desired in the present invention may not be obtained.

In addition, the black organic colorant may be employed in an amount of 3 to 40 parts by weight, or 5 to 30 parts by weight, based on 100 parts by weight of the copolymer (A) on the basis of the solids content exclusive of solvents. If the amount of the black organic colorant is within the above range, a pattern profile upon development may be favorable, and such properties as film retention rate may be enhanced.

According to an embodiment, the black inorganic colorant may be employed in an amount of 0 to 20% by weight or 0 to 10% by weight, specifically 0.01 to 20% by weight or 0.01 to 10% by weight, based on the total weight of the solids content (i.e., the weight excluding solvents) of the colorant (D). If the amount of the black inorganic colorant is excessive, the optical density and low reflectance desired in the present invention may not be obtained.

In addition, the black inorganic colorant may be employed in an amount of 0.01 to 10 parts by weight, or 0.02 to 5 parts by weight, based on 100 parts by weight of the copolymer (A) on the basis of the solids content exclusive of solvents. If the amount of the black inorganic colorant is within the above range, a pattern profile upon development may be favorable, and such properties as film retention rate may be enhanced.

Particular examples of the colorant other than black may include C.I. Pigment Violet 13, 14, 19, 23, 25, 27, 29, 32, 33, 36, 37 and 38; and C.I. Pigment Blue 15 (15:3, 15:4, 15:6, etc.), 16, 21, 28, 60, 64, and 76. Specifically, the colorant other than black may comprise at least one colorant selected from the group consisting of a blue colorant and a violet colorant. Preferred among them are C.I. Pigment Blue 15:6 and 60, or C.I. Pigment Violet 23 from the viewpoint of lowering the reflectance.

According to an embodiment, the blue colorant may be employed in an amount of 0 to 50% by weight or 0 to 40% by weight, specifically 0.01 to 50% by weight or 0.01 to 40% by weight, based on the total weight of the solids content (i.e., the weight excluding solvents) of the colorant (D).

In addition, the violet colorant may be employed in an amount of 0 to 50% by weight or 0 to 40% by weight, specifically 0.01 to 50% by weight or 0.01 to 40% by weight, based on the total weight of the solids content (i.e., the weight excluding solvents) of the colorant (D).

In addition, the blue colorant may be employed in an amount of 0.01 to 10 parts by weight, or 0.01 to 8 parts by weight, based on 100 parts by weight of the copolymer (A) on the basis of the solids content exclusive of solvents.

Meanwhile, the violet colorant may be employed in an amount of 0.01 to 10 parts by weight, or 0.01 to 8 parts by weight, based on 100 parts by weight of the copolymer (A) on the basis of the solids content exclusive of solvents.

If the amounts of the blue colorant and the violet colorant are within the above ranges, a pattern profile upon development may be favorable, such properties as film retention rate and optical density may be enhanced, and it is possible to achieve a total reflectance as desired. However, if the amounts of the blue colorant and the violet colorant exceed the above respective ranges, the optical density and low reflectance desired in the present invention may not be obtained.

The colorant (D) may be employed in an amount of 1 to 40 parts by weight, or 2 to 30 parts by weight, based on 100 parts by weight of the copolymer (A) on the basis of the solids content exclusive of solvents. If the amount of the colorant (D) is within the above range, a pattern profile upon development may be favorable, and such properties as film retention rate may be enhanced. If the amount of the colorant (D) exceeds the above range, the optical density and low reflectance desired in the present invention may not be obtained.

The colorant (D) employed in the present invention may be used in a form mixed with a dispersant, a dispersion resin (or a binder), a solvent, and the like in order to disperse the colorant in the photosensitive resin composition.

Examples of the dispersant may include any known dispersants for a colorant. Particular examples thereof may include a cationic surfactant, an anionic surfactant, a nonionic surfactant, a zwitterionic surfactant, a silicon-based surfactant, a fluorine-based surfactant, and the like. Commercially available dispersants may include Disperbyk-182, -183, -184, -185, -2000, -2150, -2155, -2163, and -2164 from BYK Co. They may be used alone or in combination of two or more thereof. The dispersant may be added in advance to a colorant through surface treatment of the colorant therewith or added together with a colorant at the time of preparing a photosensitive resin composition.

In addition, the colorant (D) may be mixed with a dispersion resin, which may then be used in the preparation of the photosensitive resin composition. In such event, the dispersion resin used may be the copolymer (A), a known copolymer, or a mixture thereof.

That is, the colorant (D) may be in the form of a colored dispersion liquid.

The colored dispersion liquid may be prepared by mixing the colorant (D), the dispersing resin, and the dispersant at the same time and then milling them. Alternatively, it may be prepared by mixing the colorant (D) and the dispersant in advance as described above, followed by mixing them with the dispersing resin and milling them. Here, the milling is carried out until the average diameter of the raw materials of the colored dispersion liquid becomes 50 to 250 nm, 50 to 150 nm, or 50 to 110 nm. Within the above range, no multilayered structure is formed in the colored dispersion liquid, whereby a more homogeneous colored dispersion liquid can be obtained.

The colored dispersion liquid of the present invention may be employed in an amount of 20 to 70% by weight, or 30 to 60% by weight, based on the total weight of the solids content of the photosensitive resin composition.

The structure for a quantum dot barrier rib obtained from the photosensitive resin composition comprising the colorant (D) may be a multilayer cured film comprising two or more cured films and may have a total thickness of 6 μm or more. In addition, the structure for a quantum dot barrier rib may accomplish an optical density of 0.05/μm to 2.0/μm. Further, the reflectance $R_{SCI}$ measured by the SCI (specular component included) method may be 5.0% or less, 4.8% or less, 4.6% or less, 4.0% to 4.8%, or 4.0% to 4.6%, and the reflectance $R_{SCE}$ measured by the SCE (specular component excluded) method may be 0.5% or less, 0.4% or less, 0.1% to 0.5%, 0.1% to 0.4%, or 0.2% to 0.4%, at a wavelength of 360 nm to 740 nm or 550 nm. In addition, the ratio between $R_{SCI}$ and $R_{SCE}$ (i.e., $R_{SCE}/R_{SCI}$) may be 2 to 10, 2 to 9, 2 to 8, 3 to 8, 4 to 8, or 4 to 7.5. Within the above ranges, the characteristics of low reflectance and high light-shielding property may be satisfied, and light leakage of red, green, or the like may be prevented. If any of $R_{SCI}$, $R_{SCE}$, and $R_{SCE}/R_{SCI}$ is outside the above ranges, the characteristics of low reflectance and high light-shielding property may not be satisfied at the same time.

(E) Surfactant

The photosensitive resin composition of the present invention may further comprise a surfactant (E) in order to enhance the coatability and to prevent the generation of defects.

Although the kind of the surfactant (E) is not particularly limited, for example, a fluorine-based surfactant or silicon-based surfactant may be used.

The commercially available silicon-based surfactant may include DC3PA, DC7PA, SH11PA, SH21PA, and SH8400 from Dow Corning Toray Silicone, TSF-4440, TSF-4300, TSF-4445, TSF-4446, TSF-4460, and TSF-4452 from GE Toshiba Silicone, BYK-333, BYK-307, BYK-3560, BYK UV-3535, BYK-361N, BYK-354, and BYK-399 from BYK, and the like. They may be used alone or in combination of two or more thereof.

The commercially available fluorine-based surfactant may include Megaface F-470, F-471, F-475, F-482, F-489, and F-563 from Dainippon Ink Kagaku Kogyo Co. (DIC).

Preferred among these surfactants may be BYK-333 and BYK-307 from BYK and F-563 from DIC from the viewpoint of coatability of the composition.

The surfactant (E) may be employed in an amount of 0.01 to 5 parts by weight, 0.1 to 3 parts by weight, or 0.1 to 1 part by weight, based on 100 parts by weight of the copolymer (A) on the basis of the solids content exclusive of solvents. If the amount of the surfactant is within the above range, the photosensitive resin composition may be smoothly coated.

(F) Additive

In addition, the photosensitive resin composition of the present invention may further comprise at least one additive selected from the group consisting of an epoxy compound, a photobase generator, a thiol compound, and a compound derived from an epoxy resin as long as the physical properties of the photosensitive resin composition are not adversely affected.

The epoxy compound may be an unsaturated monomer containing at least one epoxy group, or a homo-oligomer or a hetero-oligomer thereof. Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, or a mixture thereof. Specifically, glycidyl (meth)acrylate may be used.

Examples of the commercially available homo-oligomer of an unsaturated monomer containing at least one epoxy group may include MIPHOTO GHP-03HHP (glycidyl methacrylate, Miwon Commercial Co., Ltd.).

The epoxy compound may further comprise the following structural unit.

Specific examples include structural units derived from styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing a halogen such as fluorostyrene, chlorostyrene, bromostyrene, and iodostyrene; styrene containing an alkoxy substituent such as methoxystyrene, ethoxystyrene, and propoxystyrene; p-hydroxy-α-methylstyrene, acetylstyrene; an ethylenically unsaturated compound containing an aromatic ring such as divinylbenzene, vinylphenol, o-vinylbenzyl methyl ether, m-vinylbenzyl methyl ether, p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, phenyl (meth) acrylate, benzyl (meth)acrylate, 2-phenoxyethyl (meth) acrylate, phenoxydiethylene glycol (meth)acrylate, p-nonylphenoxypolyethylene glycol (meth)acrylate, p-nonylphenoxypolypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, N-cyclohexylmaleimide, and the like. The structural unit derived from the compounds exemplified above may be contained in the epoxy compound alone or in combination of two or more thereof.

The epoxy compound may have a weight average molecular weight of 100 to 30,000 Da. Specifically, the epoxy compound may have a weight average molecular weight of 100 to 10,000 Da. If the weight average molecular weight of the epoxy compound is 100 Da or more, the hardness of a cured film can be more excellent. If it is 30,000 Da or less, the thickness of a cured film becomes uniform with a smaller step difference, which is more suitable for planarization.

The epoxy compound may be employed in an amount of 0 to 3 parts by weight, 0.01 to 3 parts by weight, or 0.1 to 1 part by weight, based on 100 parts by weight of the copolymer (A) on the basis of the solids content exclusive of solvents. Within the above range, a pattern profile upon development may be favorable, and the chemical resistance and planarization may be enhanced.

In addition, the photobase generator may comprise a compound having a property of generating a base upon irradiation of light (or an activated energy ray). For example, it may comprise a highly sensitive compound having a photosensitive range even at a wavelength of 300 nm or more.

The photobase generator may comprise a crosslinkable compound comprising a polyamine photobase generator component. As the present invention comprises such a photobase generator, it is possible to cure at a low temperature and/or during a short period of time when a cured film is prepared and to form a fine pattern. In addition, since the photobase generator generates a base upon irradiation of light (e.g., UV), it is not inhibited by oxygen in the air, so that it is useful for preventing corrosion or deterioration of the cured film.

When the photobase generator is exposed to light, the pendant photobase group of the polyamine photobase generator component is fragmented or photodecomposed to provide an amine group. The amine group may react with the amine-reactive group of the polyfunctional amine-reactive component to crosslink the (meth)acrylate copolymer component.

According to an embodiment, the applicable photobase generator includes WPB G-018 (Wako, CAS No. 122831-05-7, 9-anthrimethyl-N,N-diethylcarbamate), WPB G-027 (CAS No. 1203424-93-4, (E)-1-piperidino-3-(2-hydroxyphenyl)-2-propen-1-one), WPBG-266 (CAS No. 1632211-89-2, 1,2-diisopropyl-3-bis(dimethylamino)methylene)guanidium 2-(3-benzoylphenyl)propionate), WPBG-300 (CAS No. 1801263-71-7, 1,2-dicyclohexyl-4,4,5,5-tetramethylbiguanidinium n-butyltriphenylborate), and the like. The photobase generator may be used alone or in combination of two or more thereof.

The photobase generator may be employed in an amount of 0 to 10 parts by weight, specifically 0 to 6 parts by weight, more specifically 0.01 to 5 parts by weight, based on 100 parts by weight of the copolymer (A) on the basis of the solids content exclusive of solvents. Within the above range, a pattern profile upon development may be favorable, and the chemical resistance may be excellent.

The thiol-based compound may be used as an additive for free radicals or catalytic functions. It may increase the photocuring conversion rate through UV irradiation or a thermal reaction, and it may increase the epoxy conversion rate by lowering the reaction energy through a thermal reaction. The thiol-based compound prevents the extinction of radicals by oxygen. It also produces the effect of making the structure denser by increasing the degree of crosslinking by a crosslinking action with the photopolymerizable compound (B), thereby improving the degree of curing even at a low temperature.

Examples of the thiol-based compound include a compound having two or more mercapto groups in the molecule. For example, it may be an aliphatic thiol compound or an aromatic thiol compound.

Examples of the aliphatic thiol compound may include methanedithiol, 1,2-ethanedithiol, 1,2-propanedithiol, 1,3-propanedithiol, 1,4-butanedithiol, 1,5-pentanedithiol, 1,6-hexanedithiol, 1,2-cyclohexanedithiol, 3,4-dimethoxybutane-1,2-dithiol, 2-methylcyclohexane-2,3-dithiol, 1,2-dimercaptopropyl methyl ether, 2,3-dimercaptopropyl methyl ether, bis(2-mercaptoethyl) ether, tetrakis(mercaptomethyl)methane, bis(mercaptomethyl) sulfide, bis(mercaptomethyl) disulfide, bis(mercaptoethyl) sulfide, bis(mercaptoethyl) disulfide, bis(mercaptomethylthio)methane, bis(2-mercaptoethylthio)methane, 1,2-bis(mercaptomethylthio)ethane, 1,2-bis(2-mercaptoethylthio)ethane, 1,3-bis(mercaptomethylthio)propane, 1,3-bis(2-mercaptoethylthio)propane, 1,2,3-tris(mercaptomethylthio)propane, 1,2,3-tris(2-mercaptoethylthio)propane, 1,2,3-tris(3-mercaptopropylthio)propane, 4-mercaptomethyl-1,8-dimercapto-3,6-dithiaoctane, 5,7-dimercaptomethyl-1,11-dimercapto-3,6,9-trithiaundecane, 4,7-dimercaptomethyl-1,11-dimercapto-3,6,9-trithiaundecane, 4,8-dimercaptomethyl-1,11-dimercapto-3,6,9-trithiaundecane, 1,1,3,3-tetrakis(mercaptomethylthio)propane, 4,6-bis(mercaptomethylthio)-1,3-dithiane, 2-(2,2-bis(mercaptomethylthio)ethyl)-1,3-dithiethane, tetrakis(mercaptomethylthiomethyl)methane, tetrakis(2-mercaptoethylthiomethyl)methane, bis(2,3-dimercaptopropyl) sulfide, 2,5-bismercaptomethyl-1,4-dithiane, ethylene glycol bis(2-mercapto acetate), ethylene glycol bis(3-mercapto propionate), diethylene glycol bis(2-mercapto acetate), diethylene glycol bis(3-mercaptopropionate), 2,3-dimercapto-1-propanol (3-mercaptopropionate), 3-mercapto-1,2-propanediol bis(2-mercaptoacetate), 3-mercapto-1,2-propanediol di(3-mercaptopropionate), trimethylolpropane tris(2-mercaptoacetate), ditrimethylolpropane tetrakis(2-mercaptoacetate), trimethylolpropane tris(3-mercaptopropionate), ditrimethylolpropane tetrakis(3-mercaptopropionate), trimethylolethane tris(2-mercaptoacetate), trimethylolethane tris(3-mercaptopropionate), pentaerythritol tetrakis(2-mercaptoacetate), dipentaerythritol hexa(2-mercaptoacetate), pentaerythritol di(3-mercaptopropionate), pentaerythritol tris(3-mercaptopropionate), pentaerythritol tetra(3-mercaptopropionate) (PETMP), dipentaerythritol hexa(3-mercaptopropionate), glycerin di(2-mercaptoacetate), glycerin tris(2-mercaptoacetate), glycerin di(3-mercaptopropionate), glycerin tris(3-mercaptopropionate), 1,4-cyclohexanediol bis(2-mercaptoacetate), 1,4-cyclohexanediol bis(3-mercaptopropionate), hydroxymethyl sulfide bis(2-mercaptoacetate), hydroxymethyl sulfide bis(3-mercaptopropionate), hydroxyethyl sulfide (2-mercaptoacetate), hydroxyethyl sulfide (3-mercaptopropionate), hydroxymethyldisulfide (2-mercaptoacetate), hydroxymethyldisulfide (3-mercaptopropionate), thioglycolic acid bis(2-mercaptoethyl ester), thiodipropionic acid bis(2-mercaptoethyl ester), and N,N',N''-tris(β-mercaptopropylcarbonyloxyethyl) isocyanurate.

Examples of the aromatic thiol compound may include 1,2-dimercaptobenzene, 1,3-dimercaptobenzene, 1,4-dimercaptobenzene, 1,2-bis(mercaptomethyl)benzene, 1,4-bis(mercaptomethyl)benzene, 1,2-bis(mercaptoethyl)benzene, 1,4-bis(mercaptoethyl)benzene, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene, 1,3,5-tris(mercaptomethyl)benzene, 1,2,3-tris(mercaptoethyl)benzene, 1,3,5-tris(mercaptoethyl)benzene, 1,2,4-tris(mercaptoethyl)benzene, 2,5-toluenedithiol, 3,4-toluenediol, 1,4-naphthalenediol, 1,5-naphthalenediol, 2,6-naphthalenediol, 2,7-naphthalenediol, 1,2,3,4-tetramercaptobenzene, 1,2,3,5-tetramercaptobenzene, 1,2,4,5-tetramercaptobenzene, 1,2,3,4-tetrakis(mercaptomethyl)benzene, 1,2,3,5-tetrakis(mercaptomethyl)benzene, 1,2,4,5-tetrakis(mercaptomethyl)benzene, 1,2,3,4-tetrakis(mercaptoethyl)benzene, 1,2,3,5-tetrakis (mercaptoethyl)benzene, 1,2,4,5-tetrakis(mercaptoethyl)benzene, 2,2'-dimercaptobiphenyl, and 4,4'-dimercaptobiphenyl.

The thiol-based compound may be an aliphatic thiol compound. Specifically, it may include pentaerythritol tetra (3-mercaptopropionate) (PETMP), SIRIUS-501 (SUBARU-501, Osaka Yukikagaku Kogyo Co., Ltd.), and glycoluril derivatives (TS-G, SHIKOKU CHEMICALS CORPORATION).

The thiol-based compound may be employed in an amount ranging from 0 to 10 parts by weight, 0 to 6 parts by weight, or 0.01 to 5 parts by weight, based on 100 parts by weight of the copolymer (A) on the basis of the solids content exclusive of solvents. If the amount of the thiol-based compound is within the above range, a pattern profile upon development may be favorable, and the chemical resistance may be excellent.

The photosensitive resin composition of the present invention may further comprise a compound derived from an epoxy resin. The compound derived from an epoxy resin has at least one double bond, may have a cardo backbone structure, may be a novolak-based resin, or may be an acrylic acid resin containing a double bond in its side chain.

The weight average molecular weight (Mw) of the compound derived from an epoxy resin may be in the range of 3,000 to 18,000 Da, or 5,000 to 10,000 Da, when determined by gel permeation chromatography referenced to polystyrene. If the molecular weight of the compound derived from an epoxy resin is within the above range, a pattern profile upon development may be favorable, and such properties as chemical resistance and elastic restoring force may be improved.

Specifically, the compound derived from an epoxy resin may be a compound having a cardo backbone structure as represented by the following Formula 1:

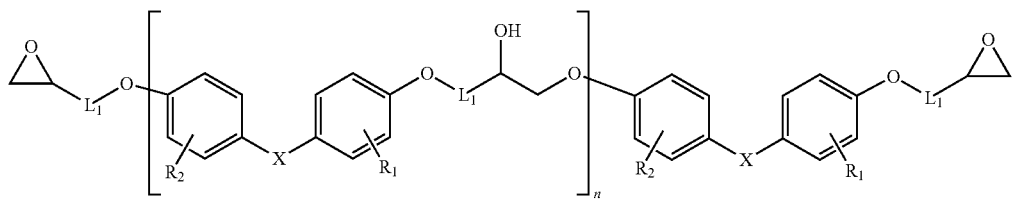

[Formula 1]

In the above Formula 1,
X is each independently

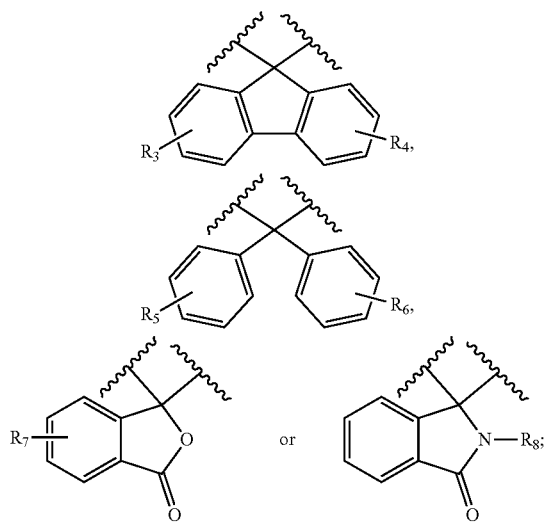

$L_1$ is each independently a $C_{1-10}$ alkylene group, a $C_{3-20}$ cycloalkylene group, or a $C_{1-10}$ alkyleneoxy group; $R_1$ to $R_7$ are each independently H, a $C_{1-10}$ alkyl group, a $C_{1-10}$ alkoxy group, a $C_{2-10}$ alkenyl group, or a $C_{6-14}$ aryl group; $R_8$ is H, methyl, ethyl, $CH_3CHCl-$, $CH_3CHOH-$, $CH_2=CHCH_2-$, or phenyl; and n is an integer from 0 to 10.

Particular examples of the $C_{1-10}$ alkylene group may include methylene, ethylene, propylene, isopropylene, butylene, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, and the like. Particular examples of the $C_{3-20}$ cycloalkylene group may include cyclopropylene, cyclobutylene, cyclopentylene, cyclohexylene, cycloheptylene, decalinylene, adamantylene, and the like. Particular examples of the $C_{1-10}$ alkyleneoxy group may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, and the like. Particular examples of the $C_{1-10}$ alkyl group may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, and the like. Particular examples of the $C_{1-10}$ alkoxy group may include methoxy, ethoxy, propoxy, butyloxy, sec-butoxy, t-butoxy, pentoxy, hexyloxy, heptoxy, octyloxy, 2-ethyl-hexyloxy, and the like. Particular examples of the $C_{2-10}$ alkenyl group may include vinyl, allyl, butenyl, propenyl, and the like. Particular examples of the $C_{6-14}$ aryl group may include phenyl, tolyl, xylyl, naphthyl, and the like.

As an example, the compound derived from the epoxy resin having a cardo backbone structure may be prepared through the following synthesis route as represented by Reaction Scheme 1.

[Reaction Scheme 1]

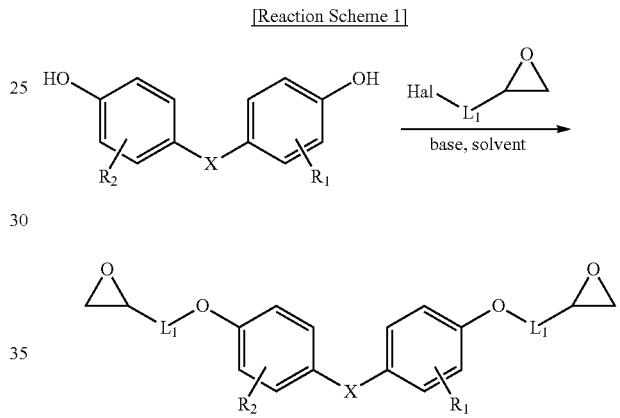

In the above Reaction Scheme 1,

Hal is halogen; and X, $R_1$, $R_2$, and $L_1$ are the same as defined in Formula 1 above.

The compound derived from an epoxy resin having a cardo backbone structure may be obtained by reacting the epoxy resin having a cardo backbone structure with an unsaturated basic acid to produce an epoxy adduct and then reacting the epoxy adduct thus obtained with a polybasic acid anhydride, or by further reacting the product thus obtained with a monofunctional or polyfunctional epoxy compound. Any unsaturated basic acid known in the art, e.g., acrylic acid, methacrylic acid, crotonic acid, cinnamic acid, sorbic acid, and the like may be used. Any polybasic acid anhydride known in the art, e.g., succinic anhydride, maleic anhydride, trimellitic anhydride, pyromellitic anhydride, 1,2,4,5-cyclohexane tetracarboxylic dianhydride, hexahydrophthalic anhydride, and the like, may be used. Any monofunctional or polyfunctional epoxy compound known in the art, e.g., glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, and the like may be used.

As an example, the compound derived from the epoxy resin having a cardo backbone structure may be prepared through the following synthesis route as represented by Reaction Scheme 2.

[Reaction Scheheme 2]

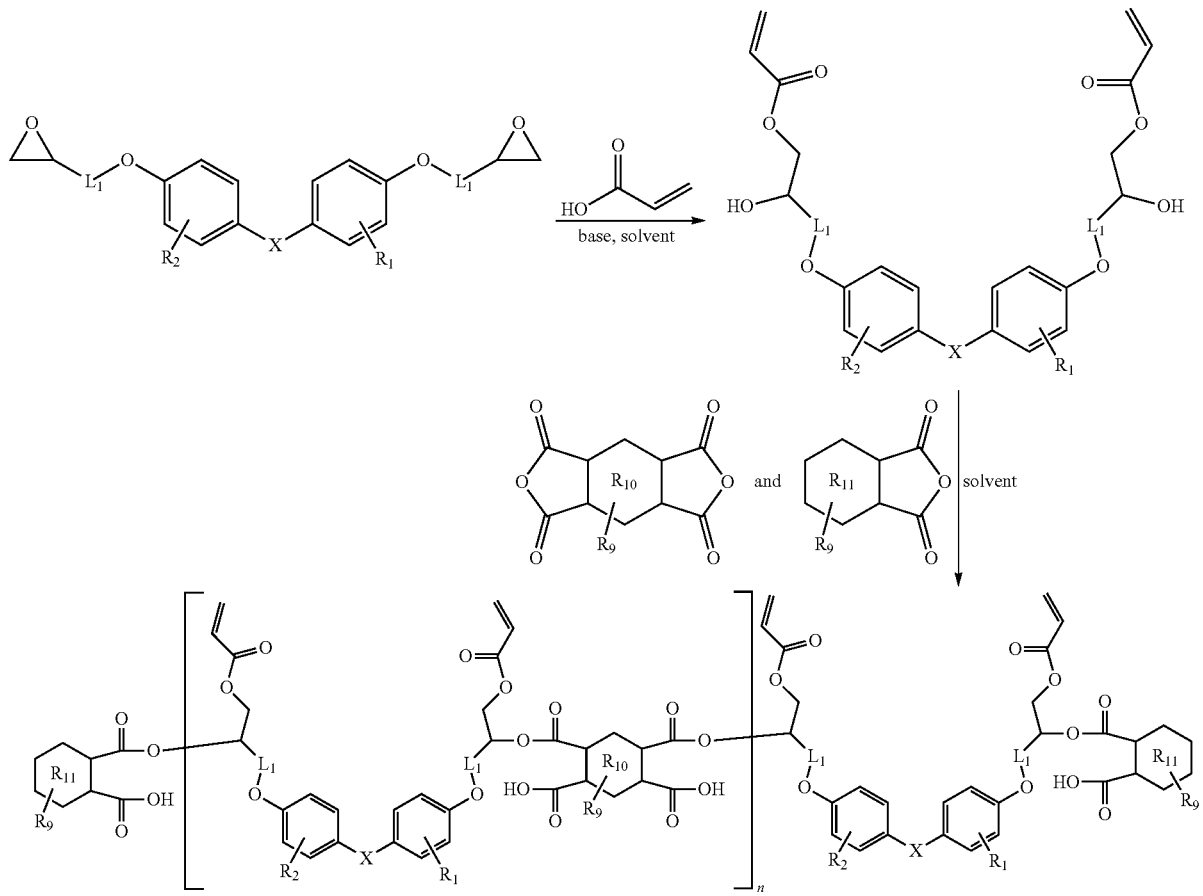

In the above Reaction Scheme 2, $R_9$ is each independently H, a $C_{1-10}$ alkyl group, a $C_{1-10}$ alkoxy group, a $C_{2-10}$ alkenyl group, or a $C_{6-14}$ aryl group; $R_{10}$ and $R_{11}$ are each independently a saturated or unsaturated $C_6$ aliphatic or aromatic ring; n is an integer from 1 to 10; and X, $R_1$, $R_2$, and $L_1$ are the same as defined in Formula 1 above.

In the case where the compound derived from the epoxy resin having a cardo backbone structure is used, the cardo backbone structure may improve the adhesiveness of a cured material to a substrate, alkaline resistance, processability, strength, and the like. Further, an image in a fine resolution may be formed in a pattern once an uncured part is removed upon development.

The compound derived from an epoxy resin may be employed in an amount of 0 to 50 parts by weight, specifically 0 to 40 parts by weight, more specifically 0.01 to 50 parts by weight, 0.01 to 40 parts by weight, or 0.01 to 30 parts by weight, based on 100 parts by weight of the copolymer (A) on the basis of the solids content exclusive of solvents. If the compound derived from an epoxy resin is employed within the above amount range, the developability and pattern profile upon development may be favorable.

(G) Solvent

The photosensitive resin composition of the present invention may be prepared as a liquid composition in which the above components are mixed with a solvent. Any solvent known in the art, which is compatible but not reactive with the components in the photosensitive resin composition, may be used as the solvent (G) in the preparation of the photosensitive resin composition.

Examples of the solvent (G) may include glycol ethers such as ethylene glycol monoethyl ether; ethylene glycol alkyl ether acetates such as ethyl cellosolve acetate; esters such as ethyl 2-hydroxypropionate; diethylene glycols such as diethylene glycol monomethyl ether; propylene glycol alkyl ether acetates such as propylene glycol monomethyl ether acetate and propylene glycol propyl ether acetate; and alkoxyalkyl acetates such as 3-methoxybutyl acetate. The solvent (G) may be used alone or in combination of two or more.

The amount of the solvent (G) is not specifically limited, but may be 50 to 200 parts by weight, or 80 to 150 parts by weight, based on 100 parts by weight of the copolymer (A) on the basis of the solids content exclusive of solvents from the viewpoint of the coatability and stability of the photosensitive resin composition finally obtained. If the amount of the solvent is within the above range, the resin composition is smoothly coated, and the delay margin, which may occur in the working process, is small.

In addition, the photosensitive resin composition of the present invention may further comprise other additives such as an antioxidant and a stabilizer as long as the physical properties of the photosensitive resin composition are not adversely affected.

The photosensitive resin composition comprising the above-described components may be prepared as a liquid composition by a common method. For example, a colorant is mixed with a dispersion resin, a dispersant, and a solvent in advance and dispersed therein using a bead mill until the average particle diameter of the colorant reaches a desired value, thereby preparing a colored dispersion liquid. In such event, a surfactant and/or a copolymer may be blended in part or in entirety. Added to the dispersion liquid are the remainder of the copolymer and the surfactant, a photopolymerizable compound, and a photopolymerization initiator. An additive such as an epoxy compound or an additional solvent, if necessary, is further blended to a certain concentration, followed by sufficiently stirring them to prepare a liquid photosensitive resin composition.

The present invention may provide a structure for a quantum dot barrier rib in the form of a cured film by coating such a photosensitive resin composition on a substrate and curing it. The structure for a quantum dot barrier rib may comprise a multilayer cured film of two or more layers.

Specifically, the present invention may provide a structure for a quantum dot barrier rib, which comprises a first cured film formed from a first photosensitive resin composition and a second cured film formed from a second photosensitive resin composition on the first cured film, wherein the first photosensitive resin composition, the second photosensitive resin composition, or both comprise (A) a copolymer; (B) a photopolymerizable compound; (C) a photopolymerization initiator; and (D) a colorant comprising a black colorant, and the structure has a total thickness of 6 μm or more.

The first photosensitive resin composition and the second photosensitive resin composition may be the same or different.

In addition, according to an embodiment, the first photosensitive resin composition and the second photosensitive resin composition may or may not contain fluorine.

For example, the first photosensitive resin composition may not contain fluorine, and the second photosensitive resin composition may contain fluorine.

In addition, both of the first photosensitive resin composition and the second photosensitive resin composition may not contain fluorine.

If the first photosensitive resin composition or the second photosensitive resin composition contains fluorine, the structural unit (a-4) may comprise a fluorine-containing compound when the copolymer (A) to be employed in the photosensitive resin composition is prepared. For example, the structural unit (a-4) may comprise at least one selected from the group consisting of trifluoroethyl (meth)acrylate, tetrafluoropropyl (meth)acrylate, pentafluorobenzyl (meth)acrylate, hexafluoroisopropyl (meth)acrylate, heptadecafluoro-1-nonyl (meth)acrylate, octafluoropentyl (meth)acrylate, 4-trifluoromethyl-4-hydroxy-5,5,5-trifluoro-2-pentyl (meth)acrylate, and trimethoxysilylpropyl methacrylate.

Meanwhile, the structure for a quantum dot barrier rib according to an embodiment may be a multilayer cured film composed of two layers comprising a first cured film and a second cured film.

Specifically, the multilayer cured film may be a two-layer cured film, which comprises a first cured film formed by coating a first photosensitive resin composition on a substrate and curing it; and a second cured film formed by coating a second photosensitive resin composition on the first cured film and curing it.

In the multilayer cured film composed of two layers, the first cured film and the second cured film may have a thickness of 10 μm or less, specifically 4 μm to 9 μm, more specifically 5 μm to 9 μm, respectively. In addition, the multilayer cured film composed of two layers may have a total thickness, i.e., the total thickness of the first cured film and the second cure film, of 6 μm to 20 μm, specifically 6 μm to 18 μm, more specifically 10 μm to 18 μm.

The structure for a quantum dot barrier rib according to another embodiment may be a multilayer cured film composed of three layers comprising a first cured film, a second cured film, and a third cured film.

In the multilayer cured film composed of three layers, the first cured film, the second cured film, and the third cured film may have a thickness of 8 μm or less, specifically 2 μm to 8 μm, more specifically 3 μm to 8 μm, respectively. In addition, the multilayer cured film composed of three layers may have a total thickness, i.e., the total thickness of the first cured film, the second cure film, and the third cured film, of 6 μm to 24 μm, specifically 9 μm to 24 μm, more specifically 12 μm to 24 μm.

The structure for a quantum dot barrier rib according to another embodiment may be a multilayer cured film composed of n layers comprising a first cured film, a second cured film, and an $n^{th}$ cured film Here, n may be 4 or more, specifically 4 to 10, 4 to 8, 4 to 6, or 4 to 5.

In the multilayer cured film composed of n layers, the first cured film, the second cured film, and the $n^{th}$ cured film may have a thickness of 8 μm or less, specifically 1.5 μm to 8 μm, more specifically 2 μm to 8 μm, respectively. In addition, the multilayer cured film composed of n layers may have a total thickness of 6 μm to 80 μm, specifically 6 μm to 40 μm, more specifically 6 μm to 30 μm.

The structure for a quantum dot barrier rib according to an embodiment has a large total film thickness as described above, so that excellent optical density (i.e., high light-shielding property) and low reflectance can be achieved even if the amount of the colorant is less than that in the prior art.

In the structure for a quantum dot barrier rib, the thickness and optical density of each cured film of the multilayer cured film may be the same or different. For example, the thickness of the first cured film may be the same as, or different from, the thickness of the second cured film. In addition, the optical density of the first cured film may be the same as, or different from, the optical density of the second cured film.

The cured film is measured for the height difference through the vertical motion of the equipment probe tip using SCAN PLUS, which is an α-step instrument (Alpha-step profilometer). The thickness of the cured film is obtained from the results. The thickness of the multilayer cured film is an initial film thickness. It may refer to the thickness at the time of forming the multilayer cured film, that is, the thickness of the film prepared upon pre-bake prior to the exposure and development steps in the preparation of a quantum dot barrier rib.

In the case where a single-layer cured film is obtained from the photosensitive resin composition, there is a problem that the cured film is implemented as a thin film only. In addition, in the case where a single-layer cured film is used for a quantum dot barrier rib, its thickness is thin. Thus, when a quantum dot solution is dropped, it may overflow the barrier ribs. If it overflows the barrier ribs, stains due to the mixing of colors may be generated, or the reliability may be deteriorated. In addition, if the composition is coated thick in a single layer and then cured, it is difficult to accomplish a uniformly cured film, stains may be generated by the thickness variation, or the quantum dot solution is likely to overflow the barrier ribs having a thin thickness. There is a limit to be used for a quantum dot barrier rib.

However, the multilayer cured film (or the structure for a quantum dot barrier rib) according to an embodiment has a minimum film thickness of 6 µm. In addition, since a colorant is applied, when the light of various colors of quantum dots is emitted, there is an advantage of shielding light by the barrier ribs. In addition, it is possible to form a multilayer pattern having a uniform film thickness by adjusting the number and thickness of the layers of each cured film. If a fluorine-containing cured film is applied to the final $n^{th}$ layer, when a quantum dot solution is filled in an inkjet method, it is possible to prevent the discharged quantum dot solution from overflowing into an adjacent region.

The present invention can prepare a structure for a quantum dot barrier rib in the form of a multilayer cured film by the following method. When the structure for a quantum dot barrier rib is formed, it is possible to form a multilayer pattern having a uniform film thickness suitable for the quantum dot barrier ribs in a single development process.

Specifically, the process for preparing a structure for a quantum dot barrier rib comprises coating a first photosensitive resin composition on a substrate and curing it to form a first cured film (S1); coating a second photosensitive resin composition on the first cured film and curing it to form a second cured film (S2); and exposing and developing a multilayer cured film comprising the first cured film and the second cured film to form a pattern and then curing it (S3), wherein the first photosensitive resin composition, the second photosensitive resin composition, or both may comprise (A) a copolymer; (B) a photopolymerizable compound; (C) a photopolymerization initiator; and (D) a colorant comprising a black colorant.

More specifically, the process for preparing a structure for a quantum dot barrier rib according to an embodiment may comprise coating a first photosensitive resin composition on a substrate and curing it to form a first cured film (S1).

In the step of forming the first cured film, the photosensitive resin composition according to the present invention is coated on a pre-treated substrate by a spin coating method, a slit coating method, a roll coating method, a screen printing method, an applicator method, or the like in a desired thickness, for example, 4 µm to 8 µm, which is cured to form the first cured film by removing the solvent therefrom.

Various inorganic substrates such as a glass substrate, an ITO deposition substrate, a $SiN_x$ deposition substrate, and a $SiON_x$ deposition substrate may be used as the substrate. Any material may be used for the substrate as long as it can be used for forming a structure for a quantum dot barrier rib.

The curing for forming the first cured film may be carried out at 70° C. to 140° C. for 100 seconds to 800 seconds. The curing may be carried out at one time or divided into two or more times.

When the curing is carried out at one time, it may be carried out at 70° C. to 140° C. for 100 seconds to 800 seconds, specifically at 80° C. to 130° C. for 150 seconds to 600 seconds, specifically at 90° C. to 130° C. for 150 seconds to 500 seconds.

When the curing is carried out in tow or more times, for example, it may be carried out as pre-bake at 70° C. to 100° C. for 50 seconds to 400 seconds, specifically at 70° C. to 90° C. for 100 seconds to 300 seconds, and then as mid-bake at 80° C. to 140° C. for 100 seconds to 500 seconds, specifically 90° C. to 130° C. for 100 seconds to 300 seconds.

The process for preparing a structure for a quantum dot barrier rib according to an embodiment may comprise coating a second photosensitive resin composition on the first cured film and curing it to form a second cured film (S2).

In the step of forming the second cured film, the second photosensitive resin composition is coated on the first cured film obtained in the above step S1 in a desired thickness, for example, 4 µm to 8 µm, which is cured to form the second cured film by removing the solvent therefrom.

The curing for forming the second cured film may be carried out at 70° C. to 140° C. for 100 seconds to 800 seconds. The curing may be carried out at one time or divided into two or more times.

Specifically, when the curing is carried out at one time, it may be carried out at 70° C. to 140° C. for 100 seconds to 800 seconds, specifically at 80° C. to 130° C. for 150 seconds to 600 seconds, more specifically at 90° C. to 130° C. for 150 seconds to 500 seconds.

When the curing is carried out in tow or more times, for example, it may be carried out as pre-bake at 70° C. to 100° C. for 50 seconds to 400 seconds, specifically at 70° C. to 90° C. for 100 seconds to 300 seconds, and then as mid-bake at 80° C. to 140° C. for 100 seconds to 500 seconds, specifically 90° C. to 130° C. for 100 seconds to 300 seconds.

The curing conditions for the first cured film and the second cured film may be the same or different.

In the process for preparing a structure for a quantum dot barrier rib according to an embodiment, the multilayer cured film composed of the two layers may be exposed and developed. In the case where a cured film having three or more layers is prepared, a cured film having one or more layers may be further formed on the second cured film, followed by exposure and development thereof. In such event, the photosensitive resin composition used for preparing one or more cured films formed on the second cured film may be the same or different from the photosensitive resin composition used in preparing the first cured film and the second cured film. In addition, the optical density of each cured film may be varied with the components and contents of the photosensitive resin composition used in preparing the first cured film and the second cured film.

The process for preparing a structure for a quantum dot barrier rib according to an embodiment may comprise exposing and developing a multilayer cured film comprising the first cured film and the second cured film to form a pattern and then curing it (S3).

In step S3, in order to form a pattern on the multilayer cured film thus obtained, a mask having a predetermined shape is placed thereon, which is then irradiated with activated rays of 200 nm to 500 nm. As a light source used for the irradiation, a low-pressure mercury lamp, a high-pressure mercury lamp, an extra high-pressure mercury lamp, a metal halide lamp, an argon gas laser, or the like may be used. X-ray, electronic ray, or the like may also be used, if desired. The dose of light for exposure may vary depending on the kind and the compositional ratio of the components of the composition and the thickness of a dried coating. If a high-pressure mercury lamp is used, it may be 500 mJ/cm² or less (at the wavelength of 365 nm).

After the light exposure step, an aqueous alkaline solution such as sodium carbonate, sodium hydroxide, potassium hydroxide, tetramethylammonium hydroxide, or the like as a developer is used to dissolve and remove unnecessary portions, whereby only an exposed portion remains to form a pattern. An image pattern obtained by the development is cooled to room temperature and post-baked in a hot air circulation-type drying furnace, thereby obtaining a final pattern.

The exposure may be carried out by disposing a mask so that the spacing of each pattern is 10 µm to 30 µm and irradiating an activated ray thereon.

The development may be carried out for 50 seconds to 300 seconds, specifically 100 seconds to 300 seconds.

The curing upon the formation of a pattern, that is, the post-bake is carried out at 150° C. to 300° C. for 10 minutes to 60 minutes, specifically at 180° C. to 280° C. for 20 minutes to 50 minutes, more specifically at 200° C. to 260° C. for 20 minutes to 40 minutes.

According to the process for preparing a quantum dot barrier rib according to an embodiment, it is possible to form a multilayer pattern having a uniform film thickness suitable for the quantum dot barrier ribs in a single development process.

The present invention provides a structure for a quantum dot barrier rib prepared by the process for preparing a quantum dot barrier rib according to the above embodiment.

Figure 2:
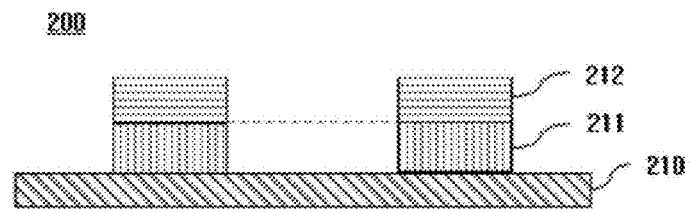
FIG. 2 is a schematic view of a structure for a quantum dot barrier rib that comprises a two-layer cured film according to an embodiment of the present invention.
Figure 3:
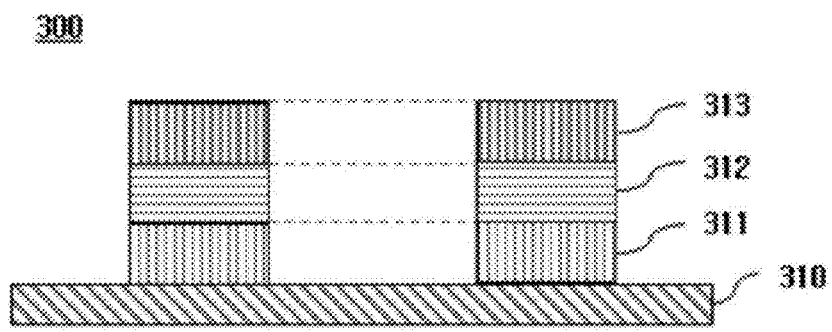
FIG. 3 is a schematic view of a structure for a quantum dot barrier rib that comprises a three-layer cured film according to an embodiment of the present invention.
Figure 4:
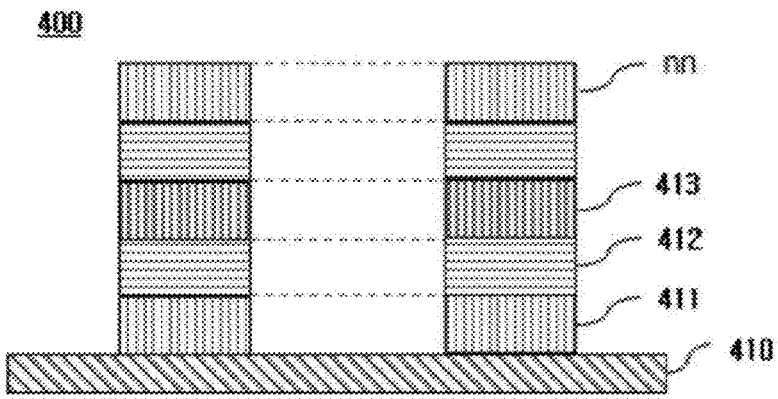
FIG. 4 is a schematic view of a structure for a quantum dot barrier rib that comprises an n-layer cured film according to an embodiment of the present invention.

In the structure for a quantum dot barrier rib according to an embodiment, a pattern is formed at regular intervals as shown in FIGS. 2 to 4. It may be composed of multiple layers having two or more layers.

The structure (200) for a quantum dot barrier rib according to an embodiment may be a multilayer structure (200) for a quantum dot barrier rib composed of two layers comprising a first cured film (211) and a second cured film (212) formed on a substrate (210) as illustrated in FIG. 2.

Specifically, the structure (200) for a quantum dot barrier rib may be a two-layer structure (200) for a quantum dot barrier rib, which is prepared by exposing and developing a two-layer cured film to form a pattern and then post-baking it, wherein the two-layer cured film comprises a first cured film (211) formed by coating a first photosensitive resin composition on a substrate (210) and curing it; and a second cured film (212) formed by coating a second photosensitive resin composition on the first cured film (211) and curing it.

The structure (300) for a quantum dot barrier rib according to another embodiment may be a multilayer structure (300) for a quantum dot barrier rib composed of three layers comprising a first cured film (311), a second cured film (312), and a third cured film (313) as illustrated in FIG. 3.

Specifically, the structure (300) for a quantum dot barrier rib may be a three-layer structure (300) for a quantum dot barrier rib, which is prepared by exposing and developing a three-layer cured film to form a pattern and then post-baking it, wherein the three-layer cured film comprises a first cured film (311) formed by coating a first photosensitive resin composition on a substrate (310) and curing it; a second cured film (312) formed by coating a second photosensitive resin composition on the first cured film (311) and curing it; and a third cured film (313) formed by coating a third photosensitive resin composition on the second cured film (312) and curing it.

The structure (400) for a quantum dot barrier rib according to another embodiment may be a multilayer structure (400) for a quantum dot barrier rib composed of n layers comprising a first cured film (411), a second cured film (412), a third cured film (413), and an $n^{th}$ cured film (nn) as illustrated in FIG. 4.

Specifically, the structure (400) for a quantum dot barrier rib may be an n-layer structure (400) for a quantum dot barrier rib, which is prepared by exposing and developing an n-layer cured film to form a pattern and then post-baking it, wherein the n-layer cured film comprises a first cured film (411) formed by coating a first photosensitive resin composition on a substrate (410) and curing it; a second cured film (412) formed by coating a second photosensitive resin composition on the first cured film (411) and curing it; a third cured film (413) formed by coating a third photosensitive resin composition on the second cured film (412) and curing it; and an $n^{th}$ cured film (nn) formed by coating an $n^{th}$ photosensitive resin composition on the third cured film (413) and curing it. Here, n may be 4 or more, specifically 4 to 10, 4 to 8, 4 to 6, or 4 to 5.

In the structure for a quantum dot barrier rib, the thicknesses and optical densities of the respective cured films may be the same or different.

The structure for a quantum dot barrier rib may have an optical density of 0.05/µm to 2.0/µm, 0.05/µm to 1.5/µm, 0.05/µm to 1.0/µm, 0.05/µm to 0.5/µm, or 0.1/µm to 0.2/µm. Here, the transmittance at 550 nm may be measured using an optical density meter (361T manufactured by Xlite) to obtain the optical density (OD, unit:/µm) based on a thickness of 1 µm. From this, the structure for a quantum dot barrier rib may have a total optical density of 0.5 to 10.0, 1.0 to 6.0, or 1.0 to 4.0. The total optical density is a value obtained by multiplying the unit optical density by the total thickness of the structure for a quantum dot barrier rib.

If the optical density and the total optical density are within the above ranges, the resolution of a display screen can be further enhanced.

The cured film of the structure for a quantum dot barrier rib is measured for the height difference through the vertical motion of the equipment probe tip using SCAN PLUS, which is an α-step instrument (Alpha-step profilometer). The thickness of the cured film is obtained from the results. The final film thickness is a value obtained by measuring the final film of the structure for a quantum dot barrier rib prepared by forming a pattern by exposure and development and then post-baking it. It includes the entire multilayer cured film, and the final film thickness may be 6 µm to 20 µm.

In addition, in the structure for a quantum dot barrier rib, the reflectance $R_{SCI}$ measured by the SCI (specular component included) method and the reflectance $R_{SCE}$ measured by the SCE (specular component excluded) method at a wavelength of 360 nm to 740 nm, or 550 nm, may satisfy the following relationships, respectively:

$$R_{SCI} \leq 5.0\% \quad \text{(Relationship 1)}$$

$$R_{SCE} \leq 0.5\% \quad \text{(Relationship 2)}$$

$$2 \leq R_{SCE}/R_{SCI} \leq 10. \quad \text{(Relationship 3)}$$

Specifically, $R_{SCI}$ may be 5.0% or less, 4.8% or less, 4.6% or less, 4.0% to 4.8%, or 4.0% to 4.6%. $R_{SCE}$ may be 0.5% or less, 0.4% or less, 0.1% to 0.5%, 0.1% to 0.4%, or 0.2% to 0.4%. The ratio between them (i.e., $R_{SCE}/R_{SCI}$) may be 2 to 10, 2 to 9, 2 to 8, 3 to 8, 4 to 8, or 4 to 7.5 Thus, the characteristics of low reflectance and high light-shielding property may be satisfied, and light leakage of red, green, or the like may be prevented.

Since the structure for a quantum dot barrier rib thus prepared has excellent properties, it can be advantageously used for quantum dot displays.

Embodiments for Carrying Out the Invention

Hereinafter, the present invention will be described in more detail with reference to the following examples. However, these examples are provided to illustrate the present invention, and the scope of the present invention is not limited thereto only.

In the following synthesis examples, the weight average molecular weight is determined by gel permeation chromatography (GPC, eluent: tetrahydrofuran) referenced to a polystyrene standard.

Synthesis Example 1: Preparation of a Copolymer (A-1)

A 500-ml, round-bottomed flask equipped with a refluxing condenser and a stirrer was charged with 100 g of a mixture consisting of 50% by mole of N-phenylmaleimide (PMI), 6% by mole of styrene (Sty), 10% by mole of 4-hydroxybutyl acrylate glycidyl ether (4-HBAGE), and 34% by mole of (meth)acrylic acid (MAA), along with 300 g of propylene glycol monomethyl ether acetate (PGMEA) as a solvent and 2 g of 2,2'-azobis(2,4-dimethylvaleronitrile) as a radical polymerization initiator. Thereafter, the mixture was heated to 70° C. and stirred for 5 hours to obtain a copolymer (A-1) solution having a solids content of 31% by weight. The copolymer thus prepared had an acid value of 100 mg KOH/g and a polystyrene-referenced weight average molecular weight (Mw) measured by gel permeation chromatography of 7,000 Da.

Synthesis Example 2: Preparation of a Copolymer (A-2)

30 g of a monomer mixture consisting of 30% by mole of methyl (meth)acrylate, 20% by mole of (meth)acrylic acid, 30% by mole of hexafluoroisopropyl (meth)acrylate, and 20% by mole of butyl (meth)acrylate and a mixture in which 2.74 g of V-59 as a radical polymerization initiator had been dissolved in 30 g of propylene glycol methyl ether acetate (PGMEA) as a solvent were added dropwise over 4 hours to a solvent heated to 80° C. in a nitrogen atmosphere in a 250-ml, round-bottomed flask equipped with a refluxing condenser and a stirrer. It was then subjected to polymerization for 20 hours to obtain a copolymer (A-2). The copolymer thus prepared had an acid value of 85 mg KOH/g, a weight average molecular weight (Mw) of 9,053 Da when measured by gel permeation chromatography and referenced to polystyrene, a solids content of 30.5% by weight, and a polydispersity (Mw/Mn) of 2.3.

Synthesis Example 3: Preparation of a Copolymer (A-3)

30 g of a monomer mixture consisting of 30% by mole of methyl (meth)acrylate, 20% by mole of (meth)acrylic acid, 30% by mole of octafluoropentyl (meth)acrylate, and 20% by mole of butyl (meth)acrylate and a mixture in which 2.74 g of V-59 as a radical polymerization initiator had been dissolved in 30 g of propylene glycol methyl ether acetate (PGMEA) as a solvent were added dropwise over 4 hours to a solvent heated to 80° C. in a nitrogen atmosphere in a 250-ml, round-bottomed flask equipped with a refluxing condenser and a stirrer. It was then subjected to polymerization for 20 hours to obtain a copolymer (A-3). The copolymer thus prepared had an acid value of 66 mg KOH/g, a weight average molecular weight (Mw) of 14,968 Da when measured by gel permeation chromatography and referenced to polystyrene, a solids content of 31.2% by weight, and a polydispersity (Mw/Mn) of 2.3.

Synthesis Example 4: Preparation of a Copolymer (A-4)

30 g of a monomer mixture consisting of 30% by mole of methyl (meth)acrylate, 20% by mole of (meth)acrylic acid, 30% by mole of trifluoroethyl (meth)acrylate, and 20% by mole of butyl (meth)acrylate and a mixture in which 2.74 g of V-59 as a radical polymerization initiator had been dissolved in 30 g of propylene glycol methyl ether acetate (PGMEA) as a solvent were added dropwise over 4 hours to a solvent heated to 80° C. in a nitrogen atmosphere in a 250-ml, round-bottomed flask equipped with a refluxing condenser and a stirrer. It was then subjected to polymerization for 20 hours to obtain a copolymer (A-4). The copolymer thus prepared had an acid value of 98 mg KOH/g, a weight average molecular weight (Mw) of 7,551 Da when measured by gel permeation chromatography and referenced to polystyrene, a solids content of 31.6% by weight, and a polydispersity (Mw/Mn) of 2.04.

The structural units used in the preparation of the copolymers of Synthesis Examples 1 to 4 and their contents are shown in Table 1 below.

TABLE 1

| | Component | Syn. Ex. 1 (A-1) | Syn. Ex. 2 (A-2) | Syn. Ex. 3 (A-3) | Syn. Ex. 4 (A-4) |
|---|---|---|---|---|---|
| | Molecular weight (Da) | 7,000 | 9,053 | 14,968 | 7,551 |
| (a-1) | (Meth)acrylic acid (MMA) (% by mole) | 34 | 20 | 20 | 20 |
| (a-2) | Styrene (% by mole) | 6 | — | — | — |
| (a-3) | 4-Hydroxybutyl acrylate glycidyl ether (4-HBAGE) (% by mole) | 10 | — | — | — |
| | N-phenylmaleimide (PMI) (% by mole) | 50 | — | — | — |
| | Methyl (meth)acrylate (MMA) (% by mole) | — | 30 | 30 | 30 |
| | Butyl (meth)acrylate (BMA) (% by mole) | — | 20 | 20 | 20 |
| (a-4) | Trifluoroethyl (meth)acrylate (TFEMA) (% by mole) | — | — | — | 30 |
| | Hexafluoroisopropyl (meth)acrylate (HFiPMA) (% by mole) | — | 30 | — | — |
| | Octafluoropentyl (meth)acrylate (OFPA) (% by mole) | — | — | 30 | — |

Preparation Example: Preparation of a Photosensitive Resin Composition

The photosensitive resin compositions of the following Preparation Examples were prepared using the copolymers prepared in the above Synthesis Examples.

The components used in the following Preparation Examples are as shown in Table 2 below.

TABLE 2

| Component | | Compound name and/or brand name | Manufacturer |
|---|---|---|---|
| Copolymer (A) | copolymer (A-1) | Synthesis Example 1 | — |
| | copolymer (A-2) | Synthesis Example 2 | — |

TABLE 2-continued

| Component | | Compound name and/or brand name | Manufacturer |
|---|---|---|---|
| | copolymer (A-3) | Synthesis Example 3 | — |
| | copolymer (A-4) | Synthesis Example 4 | — |
| Photopolymerizable compound (B) | B-1 | Dipentaerythritol hexaacrylate (DPHA) | Nippon Kayaku |
| | B-2 | Di(trimethylolpropane) tetraacrylate (T-1420) | Nippon Kayaku |
| Photopolymerization initiator (C) | C-1 | N-1919 (oxime-based photoinitiator) | ADEKA |
| | C-2 | SPI-03 (oxime-based photoinitiator) | Samyang |
| | C-3 | (E)-2-(4-styrylphenyl)-4,6-bis(trichloromethyl)-1,3,5-triazine (Triazine-Y, triazine photoinitiator) | Tronly |
| Colorant (D) | D-1 | BK-0326 (comprising carbon black) | TOKUSHIKI Co., LTD |
| | D-2 | BK-7539 (comprising organic black) | TOKUSHIKI Co., LTD |
| | D-3 | Blue-B2 (comprising Pigment Blue 15:6) | Iridos Co. Ltd. |
| | D-4 | IV-005 (comprising Pigment Violet 23) | Iridos Co. Ltd. |
| Surfactant (E) | | F563 | DIC |
| Additive (F) | Epoxy compound (F-1) | MIPHOTO GHP03HHP | Miwon |
| | Photobase generator (F-2) | WPBG-018 | Wako |
| | Thiol-based compound (F-3) | Pentaerythritol tetra (3-mercaptopropionate) (PETMP) | Aldrich |
| Solvent (G) | G-1 | Propylene glycol monomethyl ether acetate (PGMEA) | Chemtronics |
| | G-2 | 3-methoxybutyl acetate (3MBA) | Jewon |

Preparation Example

Preparation of a Photosensitive Resin Composition

Preparation Example 1-1: First Photosensitive Resin Composition 100 parts by weight (solids content) of the copolymer (A-1) obtained in Synthesis Example 1 as a copolymer, 40 parts by weight of 6-functional pentaerythritol hexaacrylate (DPHA) (B-1, Nippon Kayaku) as a photopolymerizable compound (B), 40 parts by weight of 4-functional di(trimethylolpropane) tetraacrylate (B-2, trade name T-1420, Nippon Kayaku), 2.0 parts by weight of N-1919, an oxime-based photoinitiator 1 (C-1), 1.0 parts by weight of SPI-03, an oxime-based photoinitiator 2 (C-2), and 0.4 parts by weight of (E)-2-(4-styrylphenyl)-4,6-bis(trichloromethyl)-1,3,5-triazine, a triazine photoinitiator 3 (C-3), as a photopolymerization initiator (C), 6.8 parts by weight of BK-7539 (TOKUSHIKI Co., Ltd.) as a black organic colorant (D-2), 0.2 parts by weight of F563 (DIC) as a surfactant (E), and 0.5 parts by weight of MIPHOTO GHP03HHP (Miwon), an epoxy curing agent (F-1), as an additive were uniformly mixed. Propylene glycol monomethyl ether acetate (PGMEA) was added to the mixture such that the solids content of the mixture was 25% by weight. The resultant was mixed for 2 hours using a shaker to prepare a liquid-phase photosensitive resin composition.

Preparation Example 1-2: Second Photosensitive Resin Composition

A photosensitive resin composition was prepared in the same manner as in Preparation Example 1-1, except that 0.6 parts by weight of SPI-03, an oxime-based photoinitiator 2 (C-2), and 0.4 parts by weight of (E)-2-(4-styrylphenyl)-4,6-bis(trichloromethyl)-1,3,5-triazine, a triazine photoinitiator 3 (C-3), were used as a photopolymerization initiator (C), and 12.7 parts by weight of BK-7539 (TOKUSHIKI Co., Ltd.) was used as an organic colorant (D-2), which was uniformly mixed without the addition of an additive, and that a mixture of propylene glycol monomethyl ether acetate (PGMEA) (G-1) and 3-methoxybutyl acetate (3BMA) (G-2) were added such that the solids content of the mixture was 25% by weight.

Preparation Examples 2-1 to 25-2

Photosensitive resin compositions were prepared in the same manner as in Preparation Example 1-1, except that the kinds and/or the contents of the respective components were changed as shown in Table 3 below.

TABLE 3

| | Copolymer (A) | | Photopolymerizable compound (B) | | | | Photopolymerization initiator (C) | | | | | | Colorant (D) | | | |
|---|---|---|---|---|---|---|---|---|---|---|---|---|---|---|---|---|
| P. Ex. 1-1 | A-1 | 100 | B-1 | 40 | B-2 | 40 | C-1 | 2 | C-2 | 1 | C-3 | 0.4 | D-1 | 0 | D-2 | 5.1 |
| P. Ex. 1-2 | A-1 | 100 | B-1 | 40 | B-2 | 40 | C-1 | 0 | C-2 | 0.6 | C-3 | 0.4 | D-1 | 0 | D-2 | 9.5 |
| P. Ex. 2-1 | A-1 | 100 | B-1 | 40 | B-2 | 40 | C-1 | 0 | C-2 | 1 | C-3 | 0.4 | D-1 | 0 | D-2 | 5.0 |
| P. Ex. 2-2 | A-1 | 100 | B-1 | 40 | B-2 | 40 | C-1 | 0 | C-2 | 1 | C-3 | 0.4 | D-1 | 0 | D-2 | 5.0 |
| P. Ex. 3-1 | A-1 | 100 | B-1 | 40 | B-2 | 40 | C-1 | 2 | C-2 | 1 | C-3 | 0.4 | D-1 | 0 | D-2 | 5.1 |
| P. Ex. 3-2 | A-1 | 100 | B-1 | 40 | B-2 | 40 | C-1 | 0 | C-2 | 0.3 | C-3 | 0.2 | D-1 | 0 | D-2 | 9.5 |
| P. Ex. 4-1 | A-1 | 100 | B-1 | 40 | B-2 | 40 | C-1 | 2 | C-2 | 1 | C-3 | 0.4 | D-1 | 0 | D-2 | 5.3 |
| P. Ex. 4-2 | A-1 | 100 | B-1 | 40 | B-2 | 40 | C-1 | 0 | C-2 | 0.1 | C-3 | 0.1 | D-1 | 0 | D-2 | 9.5 |
| P. Ex. 5-1 | A-1 | 100 | B-1 | 40 | B-2 | 40 | C-1 | 2 | C-2 | 1 | C-3 | 0.4 | D-1 | 0 | D-2 | 5.1 |
| P. Ex. 5-2 | A-1 | 100 | B-1 | 15 | B-2 | 65 | C-1 | 0 | C-2 | 0.1 | C-3 | 0.1 | D-1 | 0 | D-2 | 9.5 |
| P. Ex. 6-1 | A-1 | 100 | B-1 | 40 | B-2 | 40 | C-1 | 0 | C-2 | 0.6 | C-3 | 0.4 | D-1 | 0 | D-2 | 5.3 |
| P. Ex. 6-2 | A-2 | 100 | B-1 | 40 | B-2 | 40 | C-1 | 2 | C-2 | 1 | C-3 | 0.4 | D-1 | 0 | D-2 | 9.4 |
| P. Ex. 7-1 | A-1 | 100 | B-1 | 40 | B-2 | 40 | C-1 | 2 | C-2 | 1 | C-3 | 0.4 | D-1 | 0 | D-2 | 5.3 |
| P. Ex. 7-2 | A-3 | 100 | B-1 | 40 | B-2 | 40 | C-1 | 2 | C-2 | 1 | C-3 | 0.4 | D-1 | 0 | D-2 | 9.4 |
| P. Ex. 8-1 | A-1 | 100 | B-1 | 40 | B-2 | 40 | C-1 | 2 | C-2 | 1 | C-3 | 0.4 | D-1 | 0 | D-2 | 5.3 |
| P. Ex. 8-2 | A-4 | 100 | B-1 | 40 | B-2 | 40 | C-1 | 2 | C-2 | 1 | C-3 | 0.4 | D-1 | 0 | D-2 | 9.4 |

TABLE 3-continued

| | | | | | | | | | | | | | | | | |
|---|---|---|---|---|---|---|---|---|---|---|---|---|---|---|---|---|
| P. Ex. 9-1 | A-1 | 100 | B-1 | 40 | B-2 | 40 | C-1 | 2 | C-2 | 1 | C-3 | 0.4 | D-1 | 0 | D-2 | 5.1 |
| P. Ex. 9-2 | A-1 | 100 | B-1 | 15 | B-2 | 65 | C-1 | 0 | C-2 | 0.4 | C-3 | 0.4 | D-1 | 0.7 | D-2 | 11.1 |
| P. Ex. 10-1 | A-1 | 100 | B-1 | 40 | B-2 | 40 | C-1 | 2 | C-2 | 1 | C-3 | 0.4 | D-1 | 0 | D-2 | 5.1 |
| P. Ex. 10-2 | A-1 | 100 | B-1 | 40 | B-2 | 40 | C-1 | 0 | C-2 | 0.4 | C-3 | 0.4 | D-1 | 0 | D-2 | 12.6 |
| P. Ex. 11-1 | A-1 | 100 | B-1 | 40 | B-2 | 40 | C-1 | 2 | C-2 | 1 | C-3 | 0.4 | D-1 | 0 | D-2 | 5.1 |
| P. Ex. 11-2 | A-1 | 100 | B-1 | 40 | B-2 | 40 | C-1 | 0 | C-2 | 0.4 | C-3 | 0.4 | D-1 | 0 | D-2 | 10.8 |
| P. Ex. 12-1 | A-1 | 100 | B-1 | 40 | B-2 | 40 | C-1 | 2 | C-2 | 1 | C-3 | 0.4 | D-1 | 0 | D-2 | 5.1 |
| P. Ex. 12-2 | A-1 | 100 | B-1 | 40 | B-2 | 40 | C-1 | 0 | C-2 | 0.4 | C-3 | 0.4 | D-1 | 0 | D-2 | 11.1 |
| P. Ex. 13-1 | A-1 | 100 | B-1 | 40 | B-2 | 40 | C-1 | 2 | C-2 | 1 | C-3 | 0.4 | D-1 | 0 | D-2 | 5.1 |
| P. Ex. 13-2 | A-1 | 100 | B-1 | 40 | B-2 | 40 | C-1 | 0 | C-2 | 0.4 | C-3 | 0.4 | D-1 | 1.0 | D-2 | 19.0 |
| P. Ex. 14 | A-1 | 100 | B-1 | 40 | B-2 | 40 | C-1 | 0 | C-2 | 0.6 | C-3 | 0.4 | D-1 | 0 | D-2 | 9.8 |
| P. Ex. 15 | A-1 | 100 | B-1 | 40 | B-2 | 40 | C-1 | 0 | C-2 | 0.6 | C-3 | 0.4 | D-1 | 0 | D-2 | 17.3 |
| P. Ex. 16 | A-1 | 100 | B-1 | 40 | B-2 | 40 | C-1 | 0 | C-2 | 0.6 | C-3 | 0.4 | D-1 | 0 | D-2 | 5.1 |
| P. Ex. 17 | A-1 | 100 | B-1 | 40 | B-2 | 40 | C-1 | 0 | C-2 | 1 | C-3 | 0.4 | D-1 | 0 | D-2 | 5.0 |
| P. Ex. 18 | A-1 | 100 | B-1 | 40 | B-2 | 40 | C-1 | 0 | C-2 | 0.6 | C-3 | 0.4 | D-1 | 0 | D-2 | 16.8 |
| P. Ex. 19 | A-1 | 100 | B-1 | 40 | B-2 | 40 | C-1 | 0 | C-2 | 0.4 | C-3 | 0.4 | D-1 | 0.7 | D-2 | 11.1 |
| P. Ex. 20 | A-1 | 100 | B-1 | 40 | B-2 | 40 | C-1 | 0 | C-2 | 0.4 | C-3 | 0.4 | D-1 | 0 | D-2 | 12.6 |
| P. Ex. 21 | A-1 | 100 | B-1 | 40 | B-2 | 40 | C-1 | 0 | C-2 | 0.4 | C-3 | 0.4 | D-1 | 0 | D-2 | 10.8 |
| P. Ex. 22 | A-1 | 100 | B-1 | 40 | B-2 | 40 | C-1 | 0 | C-2 | 0.4 | C-3 | 0.4 | D-1 | 0 | D-2 | 11.1 |
| P. Ex. 23 | A-1 | 100 | B-1 | 40 | B-2 | 40 | C-1 | 0 | C-2 | 0.4 | C-3 | 0.4 | D-1 | 1.0 | D-2 | 19.0 |
| P. Ex. 24 | A-1 | 100 | B-1 | 40 | B-2 | 40 | C-1 | 0 | C-2 | 0.4 | C-3 | 0.4 | D-1 | 23.0 | D-2 | 69.1 |
| P. Ex. 25-1 | A-1 | 100 | B-1 | 40 | B-2 | 40 | C-1 | 2 | C-2 | 1 | C-3 | 0.4 | D-1 | 0 | D-2 | 5.1 |
| P. Ex. 25-2 | A-4 | 100 | B-1 | 40 | B-2 | 40 | C-1 | 0 | C-2 | 0.4 | C-3 | 0.4 | D-1 | 23.0 | D-2 | 69.1 |

| | Colorant (D) | | | | Surfactant (E) | Additive (F) | | | | | | Solvent (G) | | | |
|---|---|---|---|---|---|---|---|---|---|---|---|---|---|---|---|
| P. Ex. 1-1 | D3 | 0 | D4 | 0 | 0.2 | F-1 | 0.5 | F-2 | 0 | F-3 | 0 | G-1 | 100 | G-2 | 0 |
| P. Ex. 1-2 | D3 | 0 | D4 | 0 | 0.2 | F-1 | 0 | F-2 | 0 | F-3 | 0 | G-1 | 85 | G-2 | 15 |
| P. Ex. 2-1 | D3 | 0 | D4 | 0 | 0.2 | F-1 | 0 | F-2 | 0.5 | F-3 | 0 | G-1 | 85 | G-2 | 15 |
| P. Ex. 2-2 | D3 | 0 | D4 | 0 | 0.2 | F-1 | 0 | F-2 | 0.5 | F-3 | 0 | G-1 | 85 | G-2 | 15 |
| P. Ex. 3-1 | D3 | 0 | D4 | 0 | 0.2 | F-1 | 1 | F-2 | 0 | F-3 | 0 | G-1 | 85 | G-2 | 15 |
| P. Ex. 3-2 | D3 | 0 | D4 | 0 | 0.2 | F-1 | 0 | F-2 | 0.5 | F-3 | 0 | G-1 | 100 | G-2 | 0 |
| P. Ex. 4-1 | D3 | 0 | D4 | 0 | 0.2 | F-1 | 0 | F-2 | 0 | F-3 | 3 | G-1 | 85 | G-2 | 15 |
| P. Ex. 4-2 | D3 | 0 | D4 | 0 | 0.2 | F-1 | 0 | F-2 | 0.5 | F-3 | 0 | G-1 | 100 | G-2 | 0 |
| P. Ex. 5-1 | D3 | 0 | D4 | 0 | 0.2 | F-1 | 0 | F-2 | 0.5 | F-3 | 0 | G-1 | 85 | G-2 | 15 |
| P. Ex. 5-2 | D3 | 0 | D4 | 0 | 0.2 | F-1 | 0 | F-2 | 0.5 | F-3 | 0 | G-1 | 100 | G-2 | 0 |
| P. Ex. 6-1 | D3 | 0 | D4 | 0 | 0.2 | F-1 | 0 | F-2 | 0 | F-3 | 3 | G-1 | 85 | G-2 | 15 |
| P. Ex. 6-2 | D3 | 0 | D4 | 0 | 0.2 | F-1 | 0 | F-2 | 0.5 | F-3 | 3 | G-1 | 100 | G-2 | 0 |
| P. Ex. 7-1 | D3 | 0 | D4 | 0 | 0.2 | F-1 | 0 | F-2 | 0 | F-3 | 3 | G-1 | 85 | G-2 | 15 |
| P. Ex. 7-2 | D3 | 0 | D4 | 0 | 0.2 | F-1 | 0 | F-2 | 0.5 | F-3 | 3 | G-1 | 100 | G-2 | 0 |
| P. Ex. 8-1 | D3 | 0 | D4 | 0 | 0.2 | F-1 | 0 | F-2 | 0 | F-3 | 3 | G-1 | 85 | G-2 | 15 |
| P. Ex. 8-2 | D3 | 0 | D4 | 0 | 0.2 | F-1 | 0 | F-2 | 0.5 | F-3 | 3 | G-1 | 100 | G-2 | 0 |
| P. Ex. 9-1 | D3 | 0 | D4 | 0 | 0.2 | F-1 | 0 | F-2 | 0.5 | F-3 | 0 | G-1 | 85 | G-2 | 15 |
| P. Ex. 9-2 | D3 | 0 | D4 | 0 | 0.2 | F-1 | 0 | F-2 | 0.5 | F-3 | 0 | G-1 | 100 | G-2 | 0 |
| P. Ex. 10-1 | D3 | 0 | D4 | 0 | 0.2 | F-1 | 0 | F-2 | 0.5 | F-3 | 0 | G-1 | 85 | G-2 | 15 |
| P. Ex. 10-2 | D3 | 0 | D4 | 0 | 0.2 | F-1 | 0 | F-2 | 0.5 | F-3 | 0 | G-1 | 100 | G-2 | 0 |
| P. Ex. 11-1 | D3 | 0 | D4 | 0 | 0.2 | F-1 | 0 | F-2 | 0.5 | F-3 | 0 | G-1 | 85 | G-2 | 15 |
| P. Ex. 11-2 | D3 | 3.7 | D4 | 0 | 0.2 | F-1 | 0 | F-2 | 0.5 | F-3 | 0 | G-1 | 100 | G-2 | 0 |
| P. Ex. 12-1 | D3 | 0 | D4 | 0 | 0.2 | F-1 | 0 | F-2 | 0.5 | F-3 | 0 | G-1 | 85 | G-2 | 15 |
| P. Ex. 12-2 | D3 | 0 | D4 | 2.2 | 0.2 | F-1 | 0 | F-2 | 0.5 | F-3 | 0 | G-1 | 100 | G-2 | 0 |
| P. Ex. 13-1 | D3 | 0 | D4 | 0 | 0.2 | F-1 | 0 | F-2 | 0.5 | F-3 | 0 | G-1 | 85 | G-2 | 15 |
| P. Ex. 13-2 | D3 | 0 | D4 | 0 | 0.2 | F-1 | 0 | F-2 | 0.5 | F-3 | 0 | G-1 | 100 | G-2 | 0 |
| P. Ex. 14 | D3 | 0 | D4 | 0 | 0.2 | F-1 | 0 | F-2 | 0.5 | F-3 | 0 | G-1 | 85 | G-2 | 15 |
| P. Ex. 15 | D3 | 0 | D4 | 0 | 0.2 | F-1 | 0 | F-2 | 0.5 | F-3 | 0 | G-1 | 85 | G-2 | 15 |
| P. Ex. 16 | D3 | 0 | D4 | 0 | 0.2 | F-1 | 0 | F-2 | 0.5 | F-3 | 0 | G-1 | 85 | G-2 | 15 |
| P. Ex. 17 | D3 | 0 | D4 | 0 | 0.2 | F-1 | 0 | F-2 | 0 | F-3 | 0 | G-1 | 85 | G-2 | 15 |
| P. Ex. 18 | D3 | 0 | D4 | 0 | 0.2 | F-1 | 0 | F-2 | 1 | F-3 | 0 | G-1 | 100 | G-2 | 0 |
| P. Ex. 19 | D3 | 0 | D4 | 0 | 0.2 | F-1 | 0 | F-2 | 0.5 | F-3 | 0 | G-1 | 100 | G-2 | 0 |
| P. Ex. 20 | D3 | 0 | D4 | 0 | 0.2 | F-1 | 0 | F-2 | 0.5 | F-3 | 0 | G-1 | 100 | G-2 | 0 |
| P. Ex. 21 | D3 | 3.7 | D4 | 0 | 0.2 | F-1 | 0 | F-2 | 0.5 | F-3 | 0 | G-1 | 100 | G-2 | 0 |
| P. Ex. 22 | D3 | 0 | D4 | 2.2 | 0.2 | F-1 | 0 | F-2 | 0.5 | F-3 | 0 | G-1 | 100 | G-2 | 0 |
| P. Ex. 23 | D3 | 0 | D4 | 0 | 0.2 | F-1 | 0 | F-2 | 0.5 | F-3 | 0 | G-1 | 100 | G-2 | 0 |
| P. Ex. 24 | D3 | 0 | D4 | 0 | 0.2 | F-1 | 0 | F-2 | 0.5 | F-3 | 0 | G-1 | 100 | G-2 | 0 |
| P. Ex. 25-1 | D3 | 0 | D4 | 0 | 0.2 | F-1 | 0 | F-2 | 0.5 | F-3 | 0 | G-1 | 85 | G-2 | 15 |
| P. Ex. 25-2 | D3 | 0 | D4 | 0 | 0.2 | F-1 | 0 | F-2 | 0.5 | F-3 | 0 | G-1 | 100 | G-2 | 0 |

Preparation of a Structure for a Quantum Dot Barrier Rib

Example 1

The photosensitive resin composition obtained in Preparation Example 1-1 as a first photosensitive resin composition was coated on a glass substrate immersed in distilled water and then dried using a spin coater. It was pre-baked at 90° C. for 150 seconds to form a coated film in a thickness of 6.0 μm or more. The coated film was further subjected to mid-bake at 130° C. for 300 seconds to remove the solvent to form a first cured film (i.e., a lower film).

The photosensitive resin composition obtained in Preparation Example 1-2 as a second photosensitive resin composition was coated on the first cured film. It was pre-baked at 90° C. for 150 seconds to form a second cured film (i.e., an upper film) in a thickness of 6.0 μm or more, thereby preparing a multilayer cured film having two layers.

Thereafter, a mask was placed on the multilayer cured film such that an area of 5 cm by 5 cm thereof was 100% exposed to light and that the gap with the substrate was minimized in a contact manner Thereafter, it was exposed to light at an exposure dose of 150 mJ/cm$^2$ based on a wavelength of 365 nm for a certain time period using an aligner (model name: MA6) that emits light having a wavelength of 200 nm to 450 nm. It was then developed at 23° C. with an aqueous solution of potassium hydroxide diluted to a concentration of 0.04% by weight until the unexposed portion was completely washed out. The pattern thus formed was post-baked in an oven at 230° C. for 30 minutes to prepare a structure for a quantum dot barrier rib.

Examples 2 to 13

Structures for a quantum dot barrier rib comprising a multilayer cured film were prepared in the same manner as in Example 1, except that the first photosensitive resin composition and the second photosensitive resin composition (Preparation Examples 2-1 to 13-2) having the components and contents as shown in Table 3 above were used and that the development times and film thicknesses were changed as shown in Tables 4 and 6 below.

Comparative Examples 1 to 11

Structures for a quantum dot barrier rib comprising a single-layer cured film were prepared in the same manner as in Example 1, except that the photosensitive resin composition (Preparation Examples 14 to 24) having the components and contents as shown in Table 3 above was used to form a first cured film and that the development times and film thicknesses were changed as shown in Tables 4 and 6 below to prepare a single-layer cured film.

Comparative Example 12

A structure for a quantum dot barrier rib comprising a multilayer cured film was prepared in the same manner as in Example 1, except that the first photosensitive resin composition (Preparation Example 25-1) and the second photosensitive resin composition (Preparation Example 25-2) having the components and contents as shown in Table 3 above were used and that the development time and film thickness were changed as shown in Tables 4 and 6 below.

Evaluation Example 1: Development Time

At the time of development with an aqueous solution of 0.04% by weight of potassium hydroxide in the process for preparing the structures for a quantum dot barrier rib of the Examples and the Comparative Examples, the time for which the unexposed portion was completely washed out (until the stage O-ring part of the development apparatus was completely seen behind the substrate) was measured.
If the development time was 300 seconds or less, it was evaluated as ○. If it exceeded 300 seconds, it was evaluated as x.

Evaluation Example 2: Resolution and Critical Dimension of a Line Pattern

Figure 5:
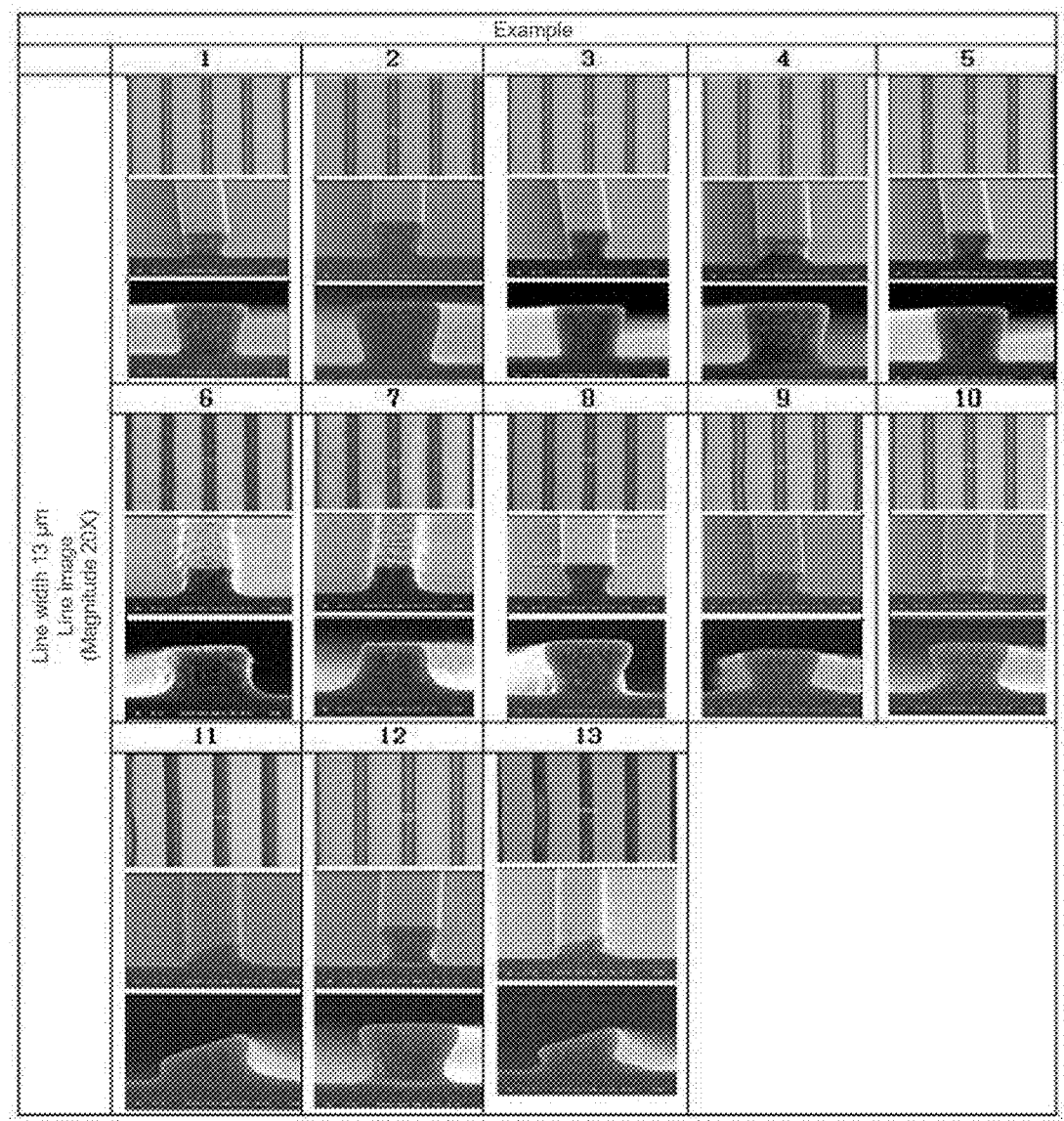
FIG. 5 is photographs of the cross-section and lateral side of the structures for a quantum dot barrier rib of Examples 1 to 13 observed with an optical microscope.
Figure 6:
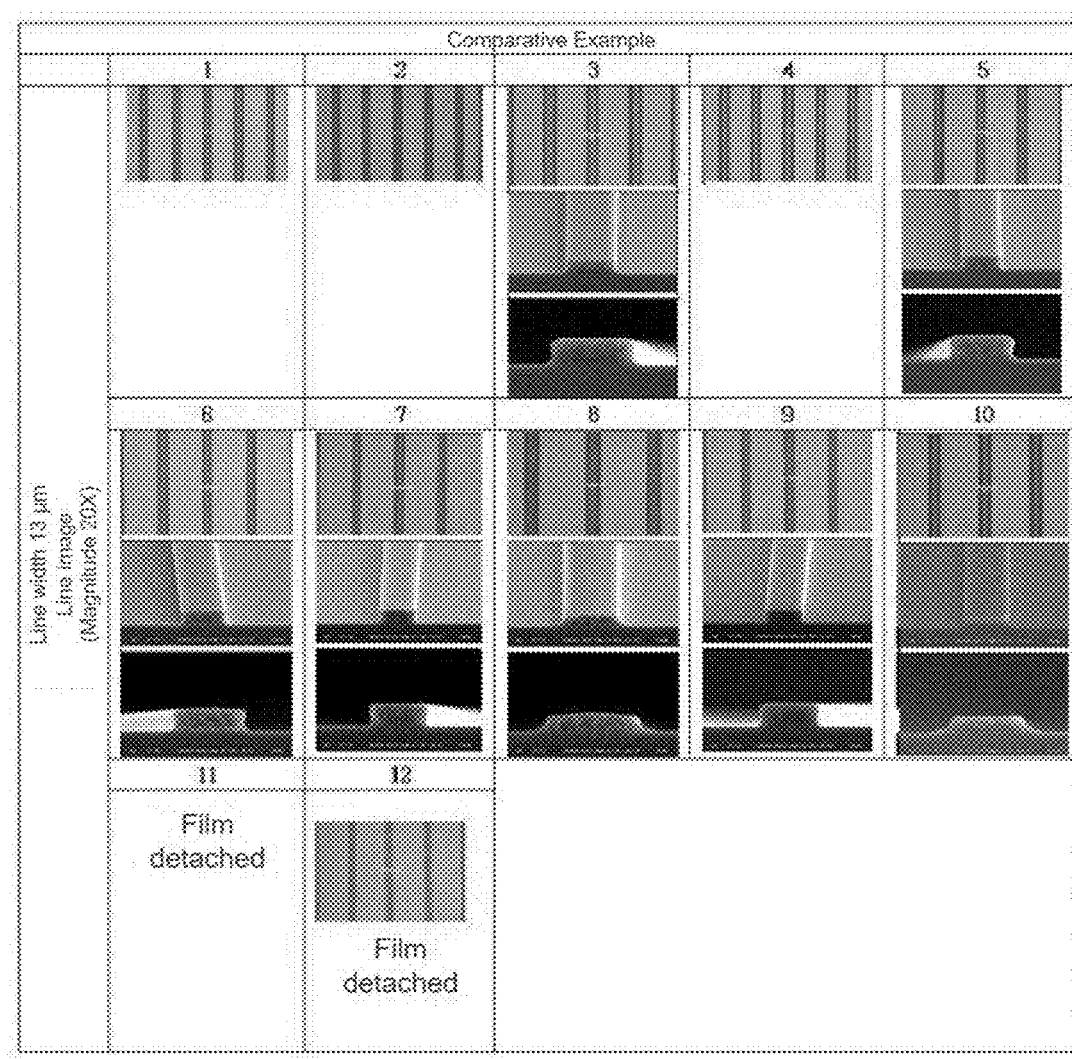
FIG. 6 is photographs of the cross-section and lateral side of the structures for a quantum dot barrier rib of Comparative Examples 1 to 12 observed with an optical microscope.

In order to measure the resolution of a pattern and the critical dimension (CD; unit: μm) of a line pattern in the structures for a quantum dot barrier rib of the Examples and the Comparative Examples, the line CD was observed with a micro-optical microscope (STM6-LM, manufacturer: OLYMPUS) and X-ray scanning electron microscope (SEM; S4300). The results are shown in FIGS. 5 and 6.

In addition, the size of a 13-μm line pattern of the photomask was observed to measure the resolution. That is, the pattern dimension of a line pattern after curing with 13 μm patterned under optimal exposure dose conditions (150 mJ/cm 2) was measured. The smaller the value, the more excellent the resolution since a smaller pattern can be formed.
If the resolution was greater than 0 to 20 μm, it was evaluated as ○. If it exceeded 20 μm, it was evaluated as x.

Evaluation Example 3: Thicknesses of a Cured Film Before and After Post-Bake

The structures for a quantum dot barrier rib of the Examples and the Comparative Examples were each measured for the height difference through the vertical motion of the equipment probe tip using SCAN PLUS, which is an α-step instrument (Alpha-step profilometer). The thickness thereof was obtained from the results.

The initial film thickness refers to a thickness of the film formed upon the pre-bake before the exposure and development steps in the preparation of a structure for a quantum dot barrier rib (i.e., film thickness before post-bake).

The final film thickness refers to a thickness of the final film of the structure for a quantum dot barrier rib formed upon the exposure and development steps to form a pattern and the post-bake thereof in the preparation of the structure for a quantum dot barrier rib (i.e., film thickness after post-bake).
If the initial film thickness and the final film thickness were multilayered, it was evaluated as ○. If they were single-layered, it was evaluated as x.

Evaluation Example 4: Optical Density

The transmittance at 550 nm of the cured films of the structures for a quantum dot barrier rib of the Examples and the Comparative Examples was measured using an optical density meter (361T manufactured by Xlite). The optical density (OD, unit: /μm) based on a thickness of 1 μm and the optical density of the final film thickness were determined. The total optical density is a value obtained by multiplying the optical density based on 1 μm by the final film thickness (In case of Comparative Examples 11 and 12, the total optical density was calculated based on the film thickness before post-bake).

Total optical density=optical density based on 1 μm (/μm)×final film thickness (μm)

Evaluation Example 5: Reflectance

The cured films of the structures for a quantum dot barrier rib of the Examples and the Comparative Examples were each measured for $R_{SCI}$ and $R_{SCE}$ using a spectrophotometer device (CM-3700A) at a wavelength of 550 nm. The ratio between them ($R_{SCE}/R_{SCI}$) was then calculated.
If $R_{SCI}$ was 5.0% or less, it was evaluated as ○. If it exceeded 5.0%, it was evaluated as x.
If $R_{SCE}$ was 0.5% or less, it was evaluated as ○. If it exceeded 0.5%, it was evaluated as x.
If $R_{SCE}/R_{SCI}$ was 2% to 10%, it was evaluated as ○. If it was less than 2.0% or greater than 10%, it was evaluated as x.

Evaluation Example 6: Contact Angle

The cured films of the structures for a quantum dot barrier rib of the Examples and the Comparative Examples were each measured for a contact angle using 2-ethoxy ethanol, a polar solvent, and a contact angle measurement device (DM300, Kyowa).

It was confirmed that the cured film containing no fluorine-containing copolymer, it was 0° and that the cured film containing a fluorine-containing copolymer had a contact angle of 10° to 20°.

The results of the Evaluation Example are shown in Tables 4 to 7 below.

TABLE 4

| | | Development time (second) | Resolution (μm) | Thickness of a cured film (μm) Before post-bake | Thickness of a cured film (μm) After post-bake | Optical density Optical density (/μm) | Optical density Total optical density |
|---|---|---|---|---|---|---|---|
| Ex. 1 | Prep. Ex. 1-1 | ○ | 160 | ○ 15 | ○ 13.30 | ○ 12.00 | 0.17 | 2.0 |
| | Prep. Ex. 1-2 | ○ | | ○ | ○ | ○ | | |
| Ex. 2 | Prep. Ex. 2-1 | ○ | 150 | ○ 16 | ○ 14.40 | ○ 13.00 | 0.11 | 1.4 |
| | Prep. Ex. 2-2 | ○ | | ○ | ○ | ○ | | |
| Ex. 3 | Prep. Ex. 3-1 | ○ | 180 | ○ 13 | ○ 13.30 | ○ 12.00 | 0.17 | 2.0 |
| | Prep. Ex. 3-1 | ○ | | ○ | ○ | ○ | | |
| Ex. 4 | Prep. Ex. 4-1 | ○ | 160 | ○ 14 | ○ 14.40 | ○ 13.00 | 0.17 | 2.2 |
| | Prep. Ex. 4-2 | ○ | | ○ | ○ | ○ | | |
| Ex. 5 | Prep. Ex. 5-1 | ○ | 150 | ○ 14 | ○ 14.40 | ○ 13.00 | 0.17 | 2.2 |
| | Prep. Ex. 5-2 | ○ | | ○ | ○ | ○ | | |
| Ex. 6 | Prep. Ex. 6-1 | ○ | 280 | ○ 13 | ○ 13.20 | ○ 11.90 | 0.17 | 2.0 |
| | Prep. Ex. 6-2 | ○ | | ○ | ○ | ○ | | |
| Ex. 7 | Prep. Ex. 7-1 | ○ | 280 | ○ 12 | ○ 12.90 | ○ 11.66 | 0.16 | 1.9 |
| | Prep. Ex. 7-2 | ○ | | ○ | ○ | ○ | | |
| Ex. 8 | Prep. Ex. 8-1 | ○ | 110 | ○ 15 | ○ 14.50 | ○ 13.12 | 0.17 | 2.2 |
| | Prep. Ex. 8-2 | ○ | | ○ | ○ | ○ | | |
| Ex. 9 | Prep. Ex. 9-1 | ○ | 160 | ○ 14 | ○ 11.50 | ○ 10.44 | 0.22 | 2.3 |
| | Prep. Ex. 9-2 | ○ | | ○ | ○ | ○ | | |
| Ex. 10 | Prep. Ex. 10-1 | ○ | 160 | ○ 15 | ○ 12.80 | ○ 11.66 | 0.22 | 2.6 |
| | Prep. Ex. 10-2 | ○ | | ○ | ○ | ○ | | |
| Ex. 11 | Prep. Ex. 11-1 | ○ | 160 | ○ 16 | ○ 12.80 | 7.29 | 0.36 | 2.6 |
| | Prep. Ex. 11-2 | ○ | | ○ | ○ | ○ | | |
| Ex. 12 | Prep. Ex. 12-1 | ○ | 180 | ○ 15 | ○ 13.20 | ○ 11.90 | 0.22 | 2.6 |
| | Prep. Ex. 12-2 | ○ | | ○ | ○ | ○ | | |
| Ex. 13 | Prep. Ex. 13-1 | ○ | 150 | ○ 12 | ○ 12.60 | 6.80 | 0.56 | 3.8 |
| | Prep. Ex. 13-2 | ○ | | ○ | ○ | ○ | | |

TABLE 5

| | | $R_{SCI}$ (%) | $R_{SCE}$ (%) | $R_{SCE}/R_{SCI}$ | Contact angle (°) |
|---|---|---|---|---|---|
| Ex. 1 | Prep. Ex. 1-1 | ○ 4.47 | ○ 0.26 | ○ 5.8 | 0 |
| | Prep. Ex. 1-2 | ○ | ○ | ○ | |
| Ex. 2 | Prep. Ex. 2-1 | ○ 4.5 | ○ 0.29 | ○ 6.4 | 0 |
| | Prep. Ex. 2-2 | ○ | ○ | ○ | |
| Ex. 3 | Prep. Ex. 3-1 | ○ 4.47 | ○ 0.26 | ○ 5.8 | 0 |
| | Prep. Ex. 3-1 | ○ | ○ | ○ | |
| Ex. 4 | Prep. Ex. 4-1 | ○ 4.47 | ○ 0.26 | ○ 5.8 | 0 |
| | Prep. Ex. 4-2 | ○ | ○ | ○ | |
| Ex. 5 | Prep. Ex. 5-1 | ○ 4.50 | ○ 0.32 | ○ 7.1 | 0 |
| | Prep. Ex. 5-2 | ○ | ○ | ○ | |
| Ex. 6 | Prep. Ex. 6-1 | ○ 4.51 | ○ 0.32 | ○ 7.1 | 12 |
| | Prep. Ex. 6-2 | ○ | ○ | ○ | |
| Ex. 7 | Prep. Ex. 7-1 | ○ 4.46 | ○ 0.24 | ○ 5.4 | 17 |
| | Prep. Ex. 7-2 | ○ | ○ | ○ | |
| Ex. 8 | Prep. Ex. 8-1 | ○ 4.46 | ○ 0.24 | ○ 5.4 | 12 |
| | Prep. Ex. 8-2 | ○ | ○ | ○ | |
| Ex. 9 | Prep. Ex. 9-1 | ○ 4.45 | ○ 0.25 | ○ 5.6 | 0 |
| | Prep. Ex. 9-2 | ○ | ○ | ○ | |
| Ex. 10 | Prep. Ex. 10-1 | ○ 4.50 | ○ 0.32 | ○ 7.1 | 0 |
| | Prep. Ex. 10-2 | ○ | ○ | ○ | |
| Ex. 11 | Prep. Ex. 11-1 | ○ 4.45 | ○ 0.24 | ○ 5.4 | 0 |
| | Prep. Ex. 11-2 | ○ | ○ | ○ | |
| Ex. 12 | Prep. Ex. 12-1 | ○ 4.46 | ○ 0.26 | ○ 5.8 | 0 |
| | Prep. Ex. 12-2 | ○ | ○ | ○ | |
| Ex. 13 | Prep. Ex. 13-1 | ○ 4.46 | ○ 0.25 | ○ 5.6 | 0 |
| | Prep. Ex. 13-2 | ○ | ○ | ○ | |

TABLE 6

| | | Development time (second) | Resolution (μm) | Thickness of a cured film (μm) Before post-bake | Thickness of a cured film (μm) After post-bake | Optical density Optical density (/μm) | Optical density Total optical density |
|---|---|---|---|---|---|---|---|
| C. Ex. 1 | Prep. Ex. 14 | ○ | 78 | ○ 12 | X 6.80 | X 5.94 | 0.23 | 1.4 |
| C. Ex. 2 | Prep. Ex. 15 | ○ | 77 | ○ 11 | X 6.70 | X 5.90 | 0.33 | 2.0 |
| C. Ex. 3 | Prep. Ex. 16 | ○ | 80 | ○ 14 | X 6.80 | X 5.95 | 0.12 | 0.7 |
| C. Ex. 4 | Prep. Ex. 17 | ○ | 72 | ○ 14 | X 6.80 | X 5.96 | 0.12 | 0.7 |
| C. Ex. 5 | Prep. Ex. 18 | ○ | 60 | ○ 12 | X 6.70 | X 5.87 | 0.22 | 1.3 |

TABLE 6-continued

|  |  | Development time (second) | Resolution (μm) | Thickness of a cured film (μm) | | | | Optical density | |
|---|---|---|---|---|---|---|---|---|---|
|  |  |  |  | Before post-bake | | After post-bake | | Optical density (/μm) | Total optical density |
| C. Ex. 6 | Prep. Ex. 19 | ○ 75 | ○ 10 | X | 6.70 | X | 5.03 | 0.40 | 2.0 |
| C. Ex. 7 | Prep. Ex. 20 | ○ 75 | ○ 11 | X | 6.60 | X | 5.31 | 0.38 | 2.0 |
| C. Ex. 8 | Prep. Ex. 21 | ○ 76 | ○ 14 | X | 6.50 | X | 4.34 | 0.46 | 2.0 |
| C. Ex. 9 | Prep. Ex. 22 | ○ 83 | ○ 10 | X | 6.60 | X | 5.31 | 0.38 | 2.0 |
| C. Ex. 10 | Prep. Ex. 23 | ○ 72 | ○ 12 | X | 6.80 | X | 3.78 | 0.90 | 3.4 |
| C. Ex. 11 | Prep. Ex. 24 | ○ 90 | X 0 | X | 6.70 | X | 0.00 | 1.0 | 6.7 |
| C. Ex. 12 | Prep. Ex. 25-1 | ○ 220 | X 0 | ○ | 12.60 | ○ | 0.00 | 0.55 | 6.9 |
|  | Prep. Ex. 25-2 | ○ |  | X |  | ○ |  | ○ |  |

TABLE 7

|  |  | $R_{SCI}$ (%) | $R_{SCE}$ (%) | $R_{SCE}/R_{SCI}$ | Contact angle (°) |
|---|---|---|---|---|---|
| C. Ex. 1 | Prep. Ex. 14 | ○ 4.53 | ○ 0.33 | ○ 7.3 | 0 |
| C. Ex. 2 | Prep. Ex. 15 | ○ 4.47 | ○ 0.27 | ○ 6.0 | 0 |
| C. Ex. 3 | Prep. Ex. 16 | X 5.05 | X 0.55 | X 10.9 | 0 |
| C. Ex. 4 | Prep. Ex. 17 | X 5.04 | X 0.55 | X 10.9 | 0 |
| C. Ex. 5 | Prep. Ex. 18 | ○ 4.53 | ○ 0.32 | ○ 7.1 | 0 |
| C. Ex. 6 | Prep. Ex. 19 | ○ 4.46 | ○ 0.29 | ○ 6.5 | 0 |
| C. Ex. 7 | Prep. Ex. 20 | ○ 4.47 | ○ 0.27 | ○ 6.0 | 0 |
| C. Ex. 8 | Prep. Ex. 21 | ○ 4.41 | ○ 0.26 | ○ 5.9 | 0 |
| C. Ex. 9 | Prep. Ex. 22 | ○ 4.36 | ○ 0.2 | ○ 4.6 | 0 |
| C. Ex. 10 | Prep. Ex. 23 | ○ 4.51 | ○ 0.32 | ○ 7.1 | 0 |
| C. Ex. 11 | Prep. Ex. 24 | ○ 4.76 | ○ 0.19 | ○ 4.0 | 0 |
| C. Ex. 12 | Prep. Ex. 25-1 | ○ 4.41 | ○ 0.2 | ○ 4.5 | 0 |
|  | Prep. Ex. 25-2 | ○ | ○ | ○ |  |

As shown in Tables 4 to 7, the structures for a quantum dot barrier rib of Examples 1 to 13 prepared from the multilayer cured films using the photosensitive resin compositions of Preparation Examples 1-1 to 13-2 had a total thickness satisfying the range of 6 μm to 20 μm. It was possible to form a sufficient thickness that could be used for quantum dot barrier ribs. If the multilayer cured film having a thickness within the above range is used as quantum dot barrier ribs, when a quantum dot solution is dropped, it does not overflow the barrier ribs. Thus, the compositions of colors are not mixed, and it is possible to prevent deterioration in the resolution.

Further, the structures for a quantum dot barrier rib of Examples 1 to 13 had an $R_{SCI}$ of 5% or less, an $R_{SCE}$ of 0.5% or less, and an $R_{SCE}/R_{SC}$ of 2 to 10. Thus, it was confirmed that they satisfied low reflectance characteristics. In addition, it was confirmed that they could accomplish high light-shielding property since the total optical densities for the final film thickness upon post-bake fell within the scope of the present invention. The resolution was excellent at a level of 12 μm to 16 μm.

In contrast, the structures for a quantum dot barrier rib of Comparative Examples 1 to 11 prepared from the single-layer cured films using the photosensitive resin compositions of Preparation Examples 14 to 24 had a total thickness of 3 μm to less than 6 μm. If the structure having such a thickness range is used as quantum dot barrier ribs, a quantum dot solution may overflow the barrier ribs, so that color separation may be difficult, and it is likely to be contaminated, resulting in deterioration in the resolution.

In particular, the structures for a quantum dot barrier rib of Comparative Examples 3 and 4 were poor in the light-shielding property since they had a total optical density of 0.7. They had an $R_{SCI}$ exceeding 5%, an $R_{SCE}$ exceeding 0.5%, and an $R_{SCE}/R_{SC}$ exceeding 10, indicating that they had high reflectance as compared with the structures for a quantum dot barrier rib of Examples 1 to 13. Thus, they fail to accomplish low reflectance and high light-shielding property as desired in the present invention.

FIGS. 5 and 6 are photographs of the cross-section and lateral side of the structures for a quantum dot barrier rib of Examples 1 to 13 and Comparative Examples 1 to 12 observed with an optical microscope.

As confirmed from FIG. 5, the cured films of the structures for a quantum dot barrier rib of Examples 1 to 13 were all clear and distinct in line width, and uniform and thick in film thickness.

In contrast, as confirmed from FIG. 6, the cured films of the structures for a quantum dot barrier rib of Comparative Examples 1 to 12 were not suitable for quantum dot barrier ribs since they had a thin thickness. In particular, in Comparative Examples 11 and 12, since the film was detached, a pattern was not formed; or it was not clear. In particular, although the structure for a quantum dot barrier rib of Comparative Example 12 was prepared as a multilayer cured film, the content of the colorant was high, so that the film was detached due to the lack of photo-curing under the optimum exposure dose condition (150 mJ/cm$^2$), resulting in a resolution of 0 μm; and the pattern was not clear.

Reference Numerals of the Drawings

100: substrate structure
110: transparent substrate
120: barrier rib
130: first quantum dot solution
140: second quantum dot solution
150: third quantum dot solution
200, 300, 400: structure for a quantum dot barrier rib
210, 310, 410: substrate
211, 311, 411: first cured film
212, 312, 412: second cured film
313, 413: third cured film
nn: n$^{th}$ cured film

The invention claimed is:
1. A structure for a quantum dot barrier rib, which comprises a cured film formed from a photosensitive resin composition comprising:
(A) copolymer;
(B) photopolymerizable compound;
(C) a photopolymerization initiator; and
(D) a colorant comprising a black colorant, wherein the structure for a quantum dot barrier rib has a total thickness of 6 μm or more, an optical density of 0.05/μm to 2.0/μm, and a reflectance $R_{SCI}$ measured by the SCI (specular component included) method and a reflectance $R_{SCE}$ measured by the SCE (specular component excluded) method at a wavelength of 550 nm that satisfy the following relationships, respectively:

$R_{SCI} \leq 5.0\%$     (Relationship 1)

$R_{SCE} \leq 0.5\%$     (Relationship 2)

$2 \leq R_{SCE}/R_{SCI} \leq 10$.     (Relationship 3)

2. The structure for a quantum dot barrier rib of claim 1, wherein the black colorant comprises at least one selected from the group consisting of a black organic colorant and a black inorganic colorant.

3. The structure for a quantum dot barrier rib of claim 2, wherein the black organic colorant is employed in an amount of 3 to 40 parts by weight based on 100 parts by weight of the copolymer (A).

4. The structure for a quantum dot barrier rib of claim 2, wherein the black inorganic colorant is employed in an amount of 0.01 to 10 parts by weight based on 100 parts by weight of the copolymer (A).

5. The structure for a quantum dot barrier rib of claim 1, wherein the colorant (D) further comprises a colorant comprising at least one selected from the group consisting of a blue colorant and a violet colorant.

6. The structure for a quantum dot barrier rib of claim 5, wherein the blue colorant and the violet colorant are employed in an amount of 0.01 to 10 parts by weight based on 100 parts by weight of the copolymer (A), respectively.

7. The structure for a quantum dot barrier rib of claim 1, wherein the colorant (D) is employed in an amount of 1 to 40 parts by weight based on 100 parts by weight of the copolymer (A).

8. The structure for a quantum dot barrier rib of claim 1, wherein the photosensitive resin composition further comprises at least one selected from the group consisting of an epoxy compound, a photobase generator, a thiol compound, and a compound derived from an epoxy resin.

9. A structure for a quantum dot barrier rib, which comprises:
   a first cured film formed from a first photosensitive resin composition and a second cured film formed from a second photosensitive resin composition on the first cured film,
   wherein the first photosensitive resin composition, the second photosensitive resin composition, or both comprise (A) a copolymer; (B) a photopolymerizable compound; (C) a photopolymerization initiator; and (D) a colorant comprising a black colorant, and
the structure has a total thickness of 6 μm or more.

10. The structure for a quantum dot barrier rib of claim 9, wherein the first cured film and the second cured film have a thickness of 10 μm or less, respectively.

11. The structure for a quantum dot barrier rib of claim 9, wherein the multilayer cured film has a total thickness of 6 μm to 20 μm.

12. The structure for a quantum dot barrier rib of claim 9, which has an optical density of 0.05/μm to 2.0/μm.

13. A process for preparing a structure for a quantum dot barrier rib, which comprises:
   coating a first photosensitive resin composition on a substrate and curing it to form a first cured film;
   coating a second photosensitive resin composition on the first cured film and curing it to form a second cured film; and
   exposing and developing a multilayer cured film comprising the first cured film and the second cured film to form a pattern and then curing it,
   wherein the first photosensitive resin composition, the second photosensitive resin composition, or both comprise (A) a copolymer; (B) a photopolymerizable compound; (C) a photopolymerization initiator; and (D) a colorant comprising a black colorant.

14. The process for preparing a structure for a quantum dot barrier rib of claim 13, wherein the curing for forming the first cured film and the second cured film is carried out at 70° C. to 140° C. for 100 seconds to 800 seconds, respectively.

15. The process for preparing a structure for a quantum dot barrier rib of claim 14, wherein the curing for forming the first cured film and the second cured film is carried out as pre-bake at 70° C. to 100° C. for 50 seconds to 400 seconds and as mid-bake at 80° C. to 140° C. for 100 seconds to 500 seconds, respectively.

16. The process for preparing a structure for a quantum dot barrier rib of claim 13, wherein the curing after the formation of a pattern is carried out at 150° C. to 300° C. for 10 minutes to 60 minutes.

17. The process for preparing a structure for a quantum dot barrier rib of claim 13, wherein the exposure is carried out by disposing a mask so that the spacing of each pattern is 10 μm to 30 μm and irradiating an activated ray.

18. The process for preparing a structure for a quantum dot barrier rib of claim 13, wherein the development is carried out for 50 seconds to 300 seconds.

19. The process for preparing a structure for a quantum dot barrier rib of claim 13, wherein one or more cured films are further formed on the second cured film.

20. The process for preparing a structure for a quantum dot barrier rib of claim 19, wherein each cured film in the multilayer cured film has a thickness of 8 μm or less, and the multilayer cured film has a total thickness of 6 μm to 20 μm.

* * * * *